United States Patent
Kawamura et al.

(10) Patent No.: US 11,178,762 B2
(45) Date of Patent: Nov. 16, 2021

(54) CONNECTION STRUCTURE FOR WIRING SUBSTRATE AND FLEXIBLE SUBSTRATE AND PACKAGE FOR HOUSING ELECTRONIC COMPONENTS

(71) Applicants: NGK Electronics Devices, Inc., Mine (JP); NGK Insulators, Ltd., Nagoya (JP)

(72) Inventors: Takashi Kawamura, Mine (JP); Masato Ishizaki, Mine (JP); Naoki Gotou, Mine (JP)

(73) Assignees: NGK Electronics Devices, Inc., Mine (JP); NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/807,677

(22) Filed: Mar. 3, 2020

(65) Prior Publication Data
US 2020/0214130 A1 Jul. 2, 2020

Related U.S. Application Data

(63) Continuation of application No. PCT/JP2018/033711, filed on Sep. 11, 2018.

(30) Foreign Application Priority Data

Sep. 11, 2017 (JP) ............................ JP2017-174391

(51) Int. Cl.
*H05K 1/11* (2006.01)
*H05K 1/14* (2006.01)
(Continued)

(52) U.S. Cl.
CPC ........... *H05K 1/118* (2013.01); *H05K 1/0243* (2013.01); *H05K 1/14* (2013.01); *H05K 5/0026* (2013.01)

(58) Field of Classification Search
CPC . H05K 1/118; H05K 1/14; H05K 1/11; H05K 1/117; H05K 1/111
See application file for complete search history.

(56) References Cited

U.S. PATENT DOCUMENTS

2005/0174190 A1* 8/2005 Yagyu ...................... H01P 5/08
333/33
2006/0082422 A1 4/2006 Yagyu et al.
(Continued)

FOREIGN PATENT DOCUMENTS

JP 2004-247980 A1 9/2004
JP 2007-005636 A1 1/2007
(Continued)

OTHER PUBLICATIONS

Japanese Office Action (Application No. 2019-541053) dated Jul. 28, 2020 (with English translation).
(Continued)

*Primary Examiner* — Hoa C Nguyen
*Assistant Examiner* — Amol H Patel
(74) *Attorney, Agent, or Firm* — Burr & Brown, PLLC

(57) ABSTRACT

A connection structure for a wiring substrate and a flexible substrate including a wiring substrate and a flexible substrate, in which the wiring substrate includes an insulating member, conductor layer, and ground layer, the flexible substrate includes an insulating sheet and metal film, and the metal film includes a signal line pad joined to the conductor layer via a joining material when viewed from the back surface of the flexible substrate. When viewed from behind the flexible substrate, there is an overlap region where the signal line pad and conductor layer overlap. In a cross-section when the overlap region is cut in a direction perpendicular to a signal transmission direction, in a case where a width of the signal line pad including the overlap region is
(Continued)

W, and a width of the conductor layer including the overlap region is $W_0$, the connection structure satisfies $W_0<W$.

8 Claims, 13 Drawing Sheets

(51) Int. Cl.
*H05K 1/02* (2006.01)
*H05K 5/00* (2006.01)

(56) References Cited

U.S. PATENT DOCUMENTS

| | | |
|---|---|---|
| 2010/0021107 A1 | 1/2010 | Naruse et al. |
| 2011/0222717 A1 | 9/2011 | Kuratani et al. |
| 2014/0085856 A1 | 3/2014 | Shirao et al. |
| 2015/0028971 A1 | 1/2015 | Hirayama |
| 2018/0130718 A1* | 5/2018 | Kawazu ............... H05K 7/00 |

FOREIGN PATENT DOCUMENTS

| | | |
|---|---|---|
| JP | 2007-123742 A1 | 5/2007 |
| JP | 2010-028006 A1 | 2/2010 |
| JP | 2014-082455 A1 | 5/2014 |
| WO | 2014/192687 A1 | 12/2014 |
| WO | 2016/186128 A1 | 11/2016 |

OTHER PUBLICATIONS

English translation of International Preliminary Report on Patentability (PCT/JP2018/033711) (Chapter I) dated Mar. 17, 2020, 9 pages.
International Search Report and Written Opinion (Application No. PCT/JP2018/033711) dated Dec. 11, 2018.
Extended European Search Report (Application No. 18854891.1) dated Jul. 28, 2021.

* cited by examiner

Fig. 4 (a)
Fig. 4 (b)
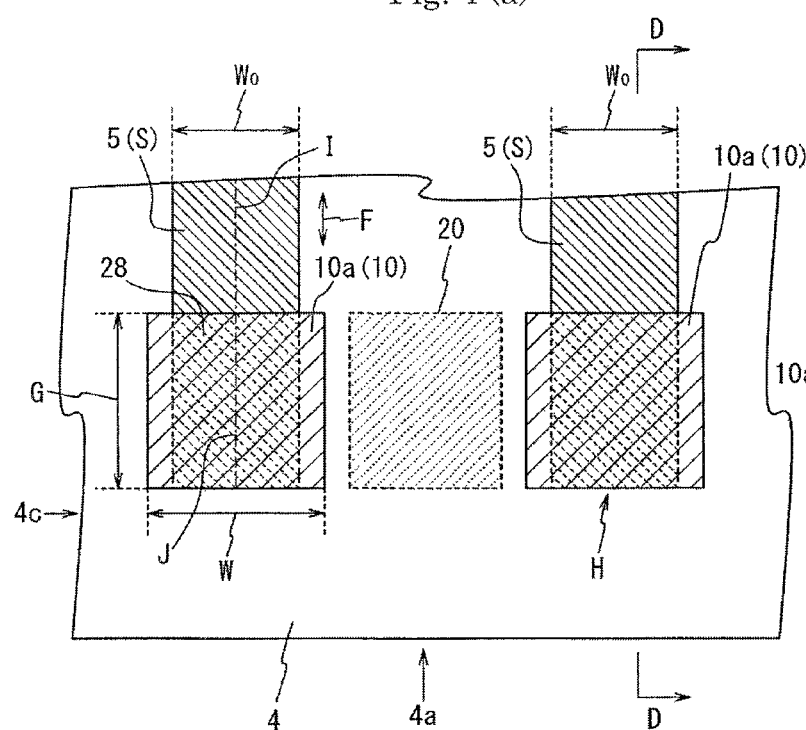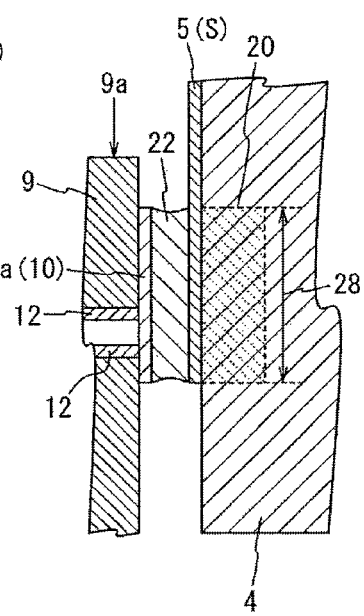

Fig. 11

| Component | | Material | Thickness, Dielectric Constant |
|---|---|---|---|
| Wiring Substrate 7 | Insulating Member 4 | Alumina | • Thickness: 440 μm<br>• Dielectric Constant: 8.7 |
| | Signal Line Conductor Layer 5(S)<br>Ground Line Conductor Layer 5(G) | Tungsten | • Thickness: 15 μm<br>(5 μm thereof is buried in ceramic)<br>• Width of Signal Line Conductor Layer 5(S): $W_0$<br>• Width of Ground Line Conductor Layer 5(G): 200 μm<br>• Distance between center lines of conductor layers (Distance between Center line I of Signal Line Conductor Layer 5(S) and Center line I of Signal Line Conductor Layer 5(S), and Distance between Center line I of Signal Line Conductor Layer 5(S) and Center line of Ground Line Conductor Layer 5(G)): 500 μm |
| Joining Material 22 | | Solder | • Thickness: 10 μm |
| Flexible Substrate 8 | Insulating Sheet 9 | Polyimide | • Thickness: 50 μm<br>• Dielectric Constant: 3.0 |
| | Signal Line Pad 10a<br>Ground Line Pad 10b | Copper Foil | • Thickness: 28 μm<br>• Width of Signal Line Pad 10a: W<br>• Width of Ground Line Pad 10b: 200 μm<br>• Distance between center lines of Pads (Distance between Center line J of Signal Line Pad 10a and Center line J of Signal Line Pad 10a, and Distance between Center line J of Signal Line Pad 10a and Center line of Ground Line Pad 10b): 500 μm |
| | Transmission Zone 10c | Copper Foil | • Thickness: 28 μm<br>• Width: 200 μm<br>• Distance between center lines of Transmission Zones 10c: 500 μm |
| | Through Conductor 12 | Copper Plating | • Thickness: 1 μm |

Fig. 12

| | $W_0$ (μm) | W (μm) | Width in which Spot Facing Portion 20 can be formed (μm) | Depth in which Spot Facing Portion 20 can be formed (μm) |
|---|---|---|---|---|
| Comparative Example 1 | 100 | 100 | 400 | 440 |
| Comparative Example 2A | 150 | 100 | 350 | 440 |
| Comparative Example 2B | 200 | 100 | 300 | 440 |
| Comparative Example 2C | 250 | 100 | 250 | 440 |
| Comparative Example 2D | 300 | 100 | 200 | 440 |
| Example A | 100 | 150 | 400 | 440 |
| Example B | 100 | 200 | 400 | 440 |
| Example C | 100 | 250 | 400 | 440 |
| Comparative Example 3 | 100 | 300 | 400 | 440 |

Fig. 13

| | Width W0 of Conductor Layer 5 (unit: μm) | Width W of Signal Line Pad 10a (unit: μm) | Maximum Width in which Spot Facing Portion 20 can be formed (unit: μm) | Maximum Depth in which Spot Facing Portion 20 can be formed (unit: μm) | Dimensions of Spot Facing Portion Width (M) × Depth (N) (unit: μm) | Characteristic Impedance (unit: Ω) | | |
|---|---|---|---|---|---|---|---|---|
| | | | | | | No deviation between Center Line I and Center Line J; A | Deviation exists between Center Line I and Center Line J (50 μm = Deviation Tolerance δ); B | Variation = (A − B) |
| Comparative Example 1 | 100 | W = W0 | 400 | 440 | 0×0 | 100 | 97.2 | 2.8 |
| Comparative Example 2A | 150 | W = (W0−δ) | 350 | 440 | 155×200 | 100 | 97.7 | 2.3 |
| Comparative Example 2B | 200 | W = (W0−2δ) | 300 | 440 | 265×400 | 100 | 98.0 | 2.0 |
| Comparative Example 2C | 250 | W = (W0−3δ) | 250 | 440 | Spot Facing Portion cannot be formed *1 | − | − | − |
| Comparative Example 2D | 300 | W = (W0−4δ) | 200 | 440 | Spot Facing Portion cannot be formed *1 | − | − | − |
| Example A | 100 | W = (W0+δ) | 400 | 440 | 100×75 | 100 | 97.4 | 2.6 |
| Example B | 100 | W = (W0+2δ) | 400 | 440 | 205×130 | 100 | 98.9 | 1.1 |
| Example C | 100 | W = (W0+3δ) | 400 | 440 | 285×250 | 100 | 99.5 | 0.5 |
| Comparative Example 3 | 100 | W = (W0+4δ) | 400 | 440 | Spot Facing Portion cannot be formed *1 | − | − | − |

*1: State in which dimensions of Spot Facing Portion that make Characteristic Impedance 100 Ω cannot be set

CONNECTION STRUCTURE FOR WIRING SUBSTRATE AND FLEXIBLE SUBSTRATE AND PACKAGE FOR HOUSING ELECTRONIC COMPONENTS

CROSS REFERENCE TO RELATED APPLICATIONS

This application is a continuation of International Application No. PCT/JP2018/033711 filed Sep. 11, 2018, which designated the United States, and claims the benefit under 35 USC § 119(a)-(d) of Japanese Application No. 2017-174391 filed Sep. 11, 2017, the entireties of which are incorporated herein by reference.

FIELD OF THE INVENTION

The present invention relates to a connection structure for a wiring substrate and a flexible substrate, which hardly causes a transmission loss of a high-frequency signal when the flexible substrate is connected to the wiring substrate, and to a package for housing electronic components using the same.

BACKGROUND ART

In recent years, with the speeding up of information communication, the communication speed of electronic devices used for the information communication has also been increased. For this reason, a package that houses the electronic devices is required to have high heat dissipation, low-loss transmission of high-frequency signals, and high reliability.

Conventionally, transmission of a high-frequency signal to a wiring substrate for transmitting a high-frequency signal has been performed via a plurality of metal pins (terminals).

In recent years, sometimes, instead of the metal pins (terminals), a flexible substrate formed by attaching a metal film for high-frequency signal transmission to the surface of a resin insulating sheet is joined and used.

In such a flexible substrate, a plurality of metal films corresponding to the above-described pins (terminals) are in close contact with the surface of a flexible resin insulating sheet while maintaining a desired interval. For this reason, when a flexible substrate is used, in comparison with a case where the pins (terminals) are individually joined and attached to the wiring substrate, since a plurality of metal films can be joined to the wiring substrate at one time, there is an advantage that its handling is very easy. In addition, when a flexible substrate is used, since the metal films can be arranged at a narrow interval, there is also an advantage that it contributes to downsizing of the package.

As prior arts related to the present invention, the following are known.

Patent Document 1 discloses, under the title of "an input/output terminal, a package for housing electronic components, and an electronic device", an invention relating to an input/output terminal, a package for housing electronic components, and an electronic device in which a flexible substrate can be used, airtight reliability is excellent, and high-frequency signal transmission efficiency is excellent.

The invention disclosed in Patent Document 1 will be described using the reference numerals in the document as they are. An input/output terminal 3 includes a connection terminal including a dielectric flat plate portion 3b having a line conductor 3a formed from one long side of an upper surface forming a rectangular shape to the other facing long side and a ground conductor 3d formed over almost the entire bottom surface and a dielectric standing wall portion 3c joined to the upper surface of the flat plate portion 3b with a part of the line conductor 3a interposed therebetween, and a flexible substrate 5 having a wiring conductor 5a and being attached to the connection terminal, in which the wiring conductor 5a is linearly arranged and connected to the line conductor 3a at one end of the line conductor 3a, and the width of a connection portion 6 in the wiring conductor 5a is 0.6 to 1 times a width of the line conductor 3a.

According to the invention disclosed in Patent Document 1 having the above configuration, since the width of the connection portion 6 in the wiring conductor 5a of the flexible substrate 5 in FIG. 1 in Patent Document 1 is set to be 0.6 to 1 times the width of the line conductor 3a, it is possible to prevent the wiring conductor 5a from protruding in the width direction of the line conductor 3a at the connection portion 6 between the line conductor 3a and the wiring conductor 5a. As a result, in the invention disclosed in Patent Document 1, the change in the electric field distribution generated from the line conductor 3a to the ground conductor 3d is small near the connection portion 6 in FIG. 1 in Patent Document 1. As a result, a decrease in an impedance value at the connection portion 6 of the line conductor 3a due to the connection between the line conductor 3a and the wiring conductor 5a is reduced. For this reason, even if a high-frequency signal is transmitted to the line conductor 3a, an abrupt change in the impedance value does not occur at the connection portion 6 with the wiring conductor 5a. That is, transmission loss such as reflection loss generated in the high-frequency signal transmitted to the connection portion 6 between the line conductor 3a and the wiring conductor 5a is reduced. Furthermore, in the invention disclosed in Patent Document 1, since the width of the wiring conductor 5a is not extremely narrow, the electrical resistance value of the wiring conductor 5a does not increase at the connection portion 6 with the line conductor 3a. That is, transmission loss due to the electrical resistance generated in the high frequency signal transmitted to the connection portion 6 can be reduced.

Patent Document 2 discloses, under the title of "package for housing elements and mounting structure", an invention relating to a package for housing elements capable of mounting elements and a mounting structure on which elements are mounted.

The package for housing elements disclosed in Patent Document 2 includes a substrate having a mounting region for mounting elements on an upper surface thereof, a frame provided on the substrate so as to surround the mounting region, and an input/output terminal provided on the frame and electrically connecting an inside of the frame and an outside of the frame, in which the input/output terminal has a plurality of wiring conductors formed from the inside of the frame to the outside of the frame, a ground layer formed on the outside of the frame, a lead terminal connected to each of the plurality of wiring conductors on the outside of the frame, and a ground terminal connected to the ground layer, and the input/output terminal has a recessed portion formed between the lead terminal and the ground terminal.

In the invention disclosed in Patent Document 2, by providing such a recessed portion at one end, it is possible to adjust the capacitive coupling generated between the wiring conductor and the ground layer. As a result, according to the invention disclosed in Patent Document 2, by changing the electric field distribution between the wiring conductor, the ground layer, and the recessed portion, it is possible to suppress the resonance of the high-frequency signal transmitted through the wiring conductor and set the characteristic impedance to a desired value, and also to improve the frequency characteristic of the wiring conductor.

In the invention disclosed in Patent Document 2, the same recessed portion may be formed between the lead terminals, and the recessed portion becomes a space having a smaller dielectric constant than the dielectric constituting the input/output terminal, thus lowering the effective dielectric constant around the wiring conductor.

PRIOR ART DOCUMENTS

Patent Documents

Patent Document 1: JP 2007-5636 A
Patent Document 2: WO2014/192687 Pamphlet

SUMMARY OF THE INVENTION

Problems to be Solved by the Invention

In general, when the adhesion strength of the metal film (corresponding to the wiring conductor 5a in Patent Document 1) in close contact with the surface of the flexible substrate to the insulating sheet body is compared with the joint strength of the conductor layer (corresponding to the line conductor 3a in Patent Document 1) in the wiring substrate to the insulating member (corresponding to the dielectric in Patent Document 1), the latter is much larger.

The reason for this is that, in a flexible substrate, a metal film is simply adhered to a resin insulating sheet body, whereas a conductor layer in a wiring substrate has a ceramic material and a conductor paste which are fired under a temperature condition of about 900 to 1600° C. to be joined.

In the invention disclosed in Patent Document 1, since the width of the wiring conductor 5a (corresponding to the conductor film) in the flexible substrate 5 shown in FIG. 4 in Patent Document 1 is set to 0.6 to 1 times the width of the line conductor 3a (corresponding to the conductor layer), it is possible to reduce the transmission loss of the high-frequency signal that occurs at the connection portion 6 between the line conductor 3a (corresponding to the conductor layer) and the wiring conductor 5a (corresponding to the metal film). On the other hand, since the width of the wiring conductor 5a (corresponding to the metal film) on the flexible substrate is relatively smaller than the width of the line conductor 3a, the decrease in the adhesion strength has been unavoidable.

In this case, in the invention disclosed in Patent Document 1, there has been a problem that the wiring conductor 5a (corresponding to the metal film) is easily peeled off from the flexible substrate, and the mechanical strength at the connection portion between the line conductor 3a and the wiring conductor 5a is reduced.

Furthermore, in the case of the invention disclosed in Patent Document 1, since it is necessary to relatively increase the width of the line conductor 3a (corresponding to the conductor layer) shown in FIG. 1 in Patent Document 1, when the input/output terminal 3 is downsized, it is unavoidable to narrow the interval between the line conductors 3a, and it becomes more difficult to form the recessed portion as disclosed in Patent Document 2 between the line conductors 3a.

According to the invention disclosed in Patent Document 2, by forming a recessed portion between a lead terminal and a ground terminal to be joined to a substrate, the characteristic impedance at the joint portion of the lead terminal and the ground terminal is easily set to a desired value, but no particular mention has been made of the case where a flexible substrate is used instead of the lead terminal and the ground terminal.

The present invention has been made in consideration of such a conventional situation and has an object to provide a connection structure for a wiring substrate and a flexible substrate and a package for housing electronic components using the same, in which when a flexible substrate is joined to a wiring substrate and used, even when a deviation occurs between the center lines of each connection target in these connection portions, a transmission loss of a high-frequency signal can be reduced, and the connection portion between the wiring substrate and the flexible substrate has a sufficient mechanical reliability.

Furthermore, in addition to the above-mentioned object, the present invention has an object to provide a connection structure for a wiring substrate and a flexible substrate and a package for housing electronic components using the same, in which a characteristic impedance can be easily designed at a connection portion between the wiring substrate and the flexible substrate.

Furthermore, in addition to the above object, the present invention has an object to provide a connection structure for a wiring substrate and a flexible substrate and a package for housing electronic components using the same, in which even when a deviation occurs between the center lines of each connection target at the connection portion between the wiring substrate and the flexible substrate, the characteristic impedance at the connection portion can be approximated to a design value when a high-frequency signal is transmitted.

Solutions to the Problems

In order to solve the above problems, a connection structure for a wiring substrate and a flexible substrate, which is a first invention, is a connection structure including a wiring substrate and a flexible substrate joined to the wiring substrate, in which: the wiring substrate includes a ceramic insulating member, a signal line conductor layer provided at least on a main surface of the insulating member, and a ground layer provided on a back surface or an inside of the insulating member; the flexible substrate includes a resin insulating sheet and a metal film provided at least on a main surface of the insulating sheet; the metal film includes a signal line pad provided on a main surface side of the flexible substrate and joined to the signal line conductor layer via a joining material; when the connection structure is seen through from a back surface side of the flexible substrate, the connection structure includes an overlap region in which the signal line pad and the signal line conductor layer are overlapped; and in a case where a width of the signal line pad belonging to the overlap region when the overlap region is cut in a direction perpendicular to a signal transmission direction is W, and a width of the signal line conductor layer belonging to the overlap region is $W_0$, the connection structure includes a useful connection portion satisfying $W_0 < W$.

In the first invention described above, the description of "when the width of the signal line pad belonging to the overlap region when the overlap region is cut in a direction perpendicular to the signal transmission direction is W, and the width of the signal line conductor layer belonging to the overlap region is $W_0$, the connection structure includes a useful connection portion satisfying $W_0 < W$" can be replaced with the description of "in a cross-section when the overlap region is cut in a direction perpendicular to the signal transmission direction, when the width of the signal line pad including the overlap region is W and the width of the signal line conductor layer including the overlap region is $W_0$, the connection structure includes a useful connection portion satisfying $W_0<W$".

In the first invention configured as described above, the insulating member constituting the wiring substrate has an effect of supporting the signal line conductor layer and the ground layer and insulating them. The signal line conductor layer constituting the wiring substrate has an effect of transmitting a high-frequency signal. Further, the ground layer constituting the wiring substrate has an effect of suppressing leakage of the high-frequency signal transmitted to the signal line conductor layer to the outside and preventing intrusion of noise from the outside to the high-frequency signal transmitted to the signal line conductor layer.

Moreover, the insulating sheet constituting the flexible substrate has an effect of supporting the metal film provided on the surface thereof and insulating the metal films provided on the main surface and back surface of the insulating sheet. Furthermore, the metal film constituting the flexible substrate has an effect of transmitting a high-frequency signal transmitted from the outside to the wiring substrate. In addition, the signal line pad made of a metal film has an effect of joining to the signal line conductor layer of the wiring substrate via the joining material.

Further, since the first invention includes a useful connection portion in which the width W of the signal line pad belonging to the overlap region and the width $W_0$ of the signal line conductor layer also belonging to the overlap region satisfy $W_0<W$, when the signal line pad is joined to the signal line conductor layer via the joining material, and when the center line of the signal line pad does not match the center line of the signal line conductor layer and a deviation occurs between the center lines, there is an effect of suppressing an increase in a facing area to the ground layer of the useful connection portion.

In addition, also in a case where the description regarding the relationship between W and $W_0$ in the first invention is replaced with the description of the first invention "includes a useful connection portion in which the width W of the signal line pad including the overlap region and the width $W_0$ of the signal line conductor layer also including the overlap region satisfy $W_0<W$", when the signal line pad is joined to the signal line conductor layer via the joining material, and when the center line of the signal line pad does not match the center line of the signal line conductor layer and a deviation occurs between the center lines, there is an effect of suppressing an increase in a facing area to the ground layer of the useful connection portion.

Thereby, there is an effect of suppressing an increase in the capacitive coupling occurring between this useful connection portion and the ground layer. As a result, the variation in the characteristic impedance due to deviation of the joining position at the connection portion between the wiring substrate and the flexible substrate in the first invention is suppressed, and there is an effect of reducing the transmission loss when a high-frequency signal passes through the connection portion between the wiring substrate and the flexible substrate.

In addition, in the useful connection portion in the first invention, since the width W of the signal line pad is also larger than the width $W_0$ of the signal line conductor layer in the useful connection portion, unlike the case of the invention disclosed in Patent Document 1, the adhesion strength of the signal line pad made of a metal film to the insulating sheet does not decrease. Therefore, according to the first invention, there is an effect of suppressing a decrease in mechanical reliability at the connection portion between the wiring substrate and the flexible substrate.

Note that, the connection portion between the signal line conductor layer and the signal line pad satisfying $W \le W_0$ (however, W and $W_0$ are "the width of the signal line pad including the overlap region" and "the width of the signal line conductor layer including the overlap region", respectively) does not correspond to the "useful connection portion" in the first invention.

A connection structure for a wiring substrate and a flexible substrate, which is a second invention, is the first invention described above, in which the insulating member includes a spot facing portion that has a recessed cross section and is formed between the overlap regions that form a pair when the wiring substrate is viewed in a plan view, and is formed at least between a starting end position and a terminating end position of the overlap region when the wiring substrate is seen through from a side surface side thereof; and the width W of the signal line pad of the useful connection portion, when a deviation tolerance of a center line of the signal line conductor layer with respect to a center line of the signal line pad is $\delta$, satisfies $W_0<W\le(W_0+3\delta)$.

In the second invention described above, the "deviation tolerance" means a degree (size) of the deviation between the center lines that occurs in the width direction (a direction perpendicular to a signal transmission direction) of the signal line pad and the signal line conductor layer.

In the second invention with the above configuration, in addition to the same effect as the effect according to the first invention described above, the spot facing portion formed on the insulating member, when the characteristic impedance at the connection portion between the wiring substrate and the flexible substrate is lower than a design value (set value), has an effect of increasing a value of the characteristic impedance so as to approach the design value.

In addition, by specifying the upper limit value of the width W of the signal line pad of the useful connection portion in the second invention as $(W_0+3\delta)$, there is an effect of avoiding a case in which the width W of the signal line pad becomes larger than necessary, and the product design for setting the characteristic impedance to the design value becomes difficult.

A connection structure for a wiring substrate and a flexible substrate, which is a third invention, is the second invention described above, in which the width W of a signal line pad at a useful connection portion satisfies $(W_0+2\delta) \le W \le (W_0+3\delta)$.

In the third invention with the above configuration, in addition to the same effect as the effect according to the second invention described above, by specifying the width W of the signal line pad in the useful connection portion between the wiring substrate and the flexible substrate within a range of $(W_0+2\delta) \le W \le (W_0+3\delta)$, more specifically, by specifying the lower limit value of the width W of the signal line pad in the second invention as described above, when the flexible substrate is connected to the wiring substrate, even when a deviation occurs between the center line of the signal line conductor layer and the center line of the signal line pad, there is an effect of making the variation in the characteristic impedance at these connection portions smaller than in the second invention.

A connection structure for a wiring substrate and a flexible substrate, which is a fourth invention, is the above-described second or third invention, in which the deviation tolerance δ satisfies δ≤60 µm.

The fourth invention with the above configuration specifically specifies the value of the deviation tolerance δ in the above second or third invention, and its effect is the same as the effect according to the above second or third invention.

A connection structure for a wiring substrate and a flexible substrate, which is a fifth invention, is each of the above-described first to fourth inventions, in which a useful connection portion occupies 50% or more of the length of the overlap region in a direction parallel to the signal transmission direction in the overlap region.

The fifth invention with the above configuration, when the width of the signal line conductor layer belonging to the overlap region is not uniform, that is, when the width of the signal line conductor layer including the overlap region is not uniform, specifies a case in which the same effect as that of each of the first to fourth inventions is exhibited as an invention.

Therefore, as in the fifth invention, when the useful connection portion occupies 50% or more of the length of the overlap region in the direction parallel to the signal transmission direction in the overlap region, there is the same effect as that in each of the first to fourth inventions described above.

A connection structure for a wiring substrate and a flexible substrate, which is a sixth invention, is each of the above-described first to fifth inventions, in which the insulating member includes a non-formation region that does not include a conductor layer on a main surface side thereof, has a substantially flat surface shape, has a strip shape, and is formed along an end surface of the insulating member.

In addition, the description of the above sixth invention can be also replaced with the description of "the insulating member includes a non-formation region on its main surface side, and this non-formation region does not include a conductor layer, has a substantially flat surface shape, and is formed in a strip shape along an end surface of the insulating member".

In the sixth invention with the above configuration, in addition to the same effect as that of each of the first to fifth inventions described above, since the insulating member includes a non-formation region on its main surface side, when manufacturing a wiring substrate constituting the sixth invention, there is an effect of making it possible to temporarily form a plating conductor layer for forming a plating film on the surface of the conductor layer in this non-formation region. In the sixth invention, since a plating conductor layer is temporarily formed in the non-formation region, a plating film can be formed on the surface of the conductor layer by an electrolytic plating process.

In the sixth invention, in particular, when the second or third invention is cited, since the insulating member includes a non-formation region, the end of the spot facing portion does not reach the end surface of the insulating member, and therefore there is an effect of increasing the mechanical strength of the wiring substrate in the vicinity of the end surface of the insulating member.

The conductor layer in the sixth invention is a concept including both a signal line conductor layer and a ground line conductor layer. Further, in each of the first to fifth inventions described above, technical contents relating particularly to the signal line conductor layer among the conductor layers are specified.

A package for housing electronic components, which is a seventh invention, includes a connection structure for a wiring substrate and a flexible substrate according to any of the first to sixth inventions, an electronic component mounting portion provided on the main surface or the back surface of the wiring substrate, and a frame portion provided so as to surround the electronic component mounting portion, the wiring substrate is inserted in the frame portion or forms a part of the frame portion, and the connection structure for a wiring substrate and a flexible substrate according to any of the first to sixth inventions is disposed outside the frame portion.

The seventh invention with the above configuration specifies the package for housing electronic components including any of the first to sixth inventions as an invention.

Therefore, the seventh invention has the same effect as that of each of the first to sixth inventions described above.

A package for housing electronic components, which is an eighth invention, includes a plate-like heat sink, an electronic component mounting portion provided on the surface of the heat sink, a frame portion provided so as to surround the electronic component mounting portion, and a connection structure for a wiring substrate and a flexible substrate according to any of the first to sixth inventions disposed outside the frame portion, in which the wiring substrate is inserted into the frame portion or forms a part of the frame portion.

The eighth invention with the above configuration specifies the package for housing electronic components including any of the first to sixth inventions as an invention.

Therefore, the eighth invention has the same effect as that of each of the first to sixth inventions described above.

The "surface" of the heat sink in the eighth invention is a concept including both the main surface and the back surface of the heat sink.

Effects of the Invention

According to the first invention as described above, when the flexible substrate is connected to the wiring substrate, when a deviation occurs between the center line of the signal line conductor layer of the wiring substrate and the center line of the signal line pad of the flexible substrate, the variation in the characteristic impedance generated in these connection portions with respect to the design value (set value) can be reduced as compared with the case where the useful connection portion in the first invention is not provided. As a result, according to the first invention, the transmission loss when the high-frequency signal passes through the connection portion between the wiring substrate and the flexible substrate can be reduced as compared with the case where the useful connection portion in the first invention is not provided. Therefore, according to the first invention, it is possible to provide a connection structure for a wiring substrate and a flexible substrate, which is excellent in reliability during transmission of a high-frequency signal.

Furthermore, in the first invention, since the width W of the signal line pad at the useful connection portion is larger than the width $W_0$ of the signal line conductor layer, the adhesion strength of the signal line pad made of a metal film to the insulating sheet does not decrease. As a result, it is possible to reduce a risk that the signal line pad is peeled off from the insulating sheet at the connection portion in the first invention. Therefore, according to the first invention, it is possible to manufacture and provide a connection structure for a wiring substrate and a flexible substrate, which is more excellent in mechanical strength at the connection portion between the wiring substrate and the flexible substrate than the invention disclosed in Patent Document 1.

According to the second invention, in addition to the same effect as the effect of the first invention described above, since the upper limit value of the width W of the signal line pad of the flexible substrate is specified, and the insulating member of the wiring substrate is provided with a spot facing portion, it is possible to increase the characteristic impedance at the connection portion between the wiring substrate and the flexible substrate so as to approach the design value (set value).

Usually, at the connection portion between the wiring substrate and the flexible substrate, the wiring substrate and the flexible substrate overlap each other, so that the characteristic impedance at that portion is locally smaller than the design value (set value). In this case, a transmission loss of the high frequency signal occurs at the connection portion between the wiring substrate and the flexible substrate.

On the other hand, in the second invention, since the insulating member is provided with a spot facing portion that is parallel to the overlap region and has at least the same length as the overlap region, it is possible to increase the characteristic impedance of the connection portion between the wiring substrate and the flexible substrate more than in the case where no spot facing portion is provided.

Therefore, according to the second invention, it becomes easier to bring the characteristic impedance at the connection portion between the wiring substrate and the flexible substrate closer to the design value than in the case of the first invention, and thereby the transmission characteristics of the high-frequency signal of the second invention can be made better than those of the first invention.

Therefore, according to the second invention, it is possible to provide a connection structure for a wiring substrate and a flexible substrate, which is more excellent in performance than in the first invention.

The third invention, in addition to the same effect as the effect of the second invention described above, specifies the width W of the signal line pad within the range of $(W_0+2\delta) \leq W \leq (W_0+3\delta)$, more specifically, sets the lower limit value of the width W of the signal line pad in the second invention to $(W_0+2\delta)$, and thus when the wiring substrate and the flexible substrate are connected, even if the center line of the signal line conductor layer does not match the center line of the signal line pad, and a deviation occurs between them, it is possible to bring the characteristic impedance at these connection portions closer to the design value (set value) than in the case of the second invention.

Therefore, according to the third invention, it is possible to provide a connection structure for a wiring substrate and a flexible substrate in which the transmission loss of the high-frequency signal at the connection portion between the wiring substrate and the flexible substrate is smaller and the mechanical reliability of the connection portion is more excellent than in the second invention described above.

The fourth invention specifically specifies the value of the deviation tolerance $\delta$ in the second or third invention described above, and the effect thereof is the same as that of the second or third invention.

The fifth invention, when the width of the signal line conductor layer belonging to the overlap region is not uniform, that is, when the width of the signal line conductor layer forming the overlap region is not uniform, specifies a case in which the same effect as the effect of each of the first to fourth inventions is exhibited as an invention.

Accordingly, the fifth invention, when the useful connection portion occupies 50% or more of the length of the overlap region in the direction parallel to the signal transmission direction in the overlap region, can exhibit the same effect as the effect of each of the first to fourth inventions.

The sixth invention, in addition to the same effect as the effect of each of the first to fifth inventions described above, can make it possible to temporarily form, in a non-formation region, a plating wiring for forming a plating film on the surface of the signal line conductor layer and the ground line conductor layer at the time of manufacturing the wiring substrate.

As a result, a plating film can be easily formed on the surface of the conductor layer by electrically connecting a plating electrode to the plating wiring.

Therefore, according to the sixth invention, when the wiring substrate includes a non-formation region, it is possible to perform an electrolytic plating process which can increase the adhesion strength of the plating film and increase the formation speed of the plating film compared to the case of performing an electroless plating process. In this case, a highly reliable plating film can be formed more efficiently than when an electroless plating process is performed.

That is, in the sixth invention, when the wiring substrate includes a non-formation region on a main surface side thereof, an electrolytic plating process can be adopted as a method of forming a plating film on the surface of the conductor layer. Such an electrolytic plating process has the merit that the adhesion strength of the plating film formed on the surface of the conductor layer is higher and the formation speed of the plating film is faster than the electroless plating process.

Therefore, according to the sixth invention, it is possible to efficiently produce a higher quality wiring substrate than when the wiring substrate does not include a non-formation region.

Both the seventh and eighth inventions are packages for housing electronic components including each of the first to sixth inventions described above, and the effects thereof are the same as the effect of each of the first to sixth inventions.

BRIEF DESCRIPTION OF THE DRAWINGS

FIG. 4(*a*) is a partial plan view of the connection structure for a wiring substrate and a flexible substrate according to Example 1 of the present invention, and FIG. 4(*b*) is a cross-sectional view taken along line D-D in FIG. 4(*a*).

FIG. 11 is a table summarizing details of materials, thicknesses, dielectric constants, and the like of each component constituting the virtual connection structure for a wiring substrate and a flexible substrate shown in FIGS. 10(a) and 10(b).

FIG. 12 is a table collectively showing a width $W_0$ of a signal line conductor layer including an overlap region and a width W of a signal line pad including the overlap region in each Example and each Comparative Example in this simulation.

FIG. 13 is a table showing, for each component shown in FIG. 10, a simulation result of a dimension of a spot facing portion for setting a characteristic impedance under the conditions shown in FIGS. 11 and 12 to 100Ω of a design value, and a variation in the characteristic impedance in a case where a deviation occurs between a center line I and a center line J.

DETAILED DESCRIPTION OF THE INVENTION

A connection structure for a wiring substrate and a flexible substrate, a package for housing electronic components using the same, and an electronic device using the same according to an embodiment of the present invention will be described with reference to FIGS. 1 to 14.

Example 1

First, a connection structure for a wiring substrate and a flexible substrate according to Example 1 of the present invention will be described with reference to FIGS. 1 to 4.

FIG. 1(a) is a plan view of a connection structure for a wiring substrate and a flexible substrate and a package for housing electronic components using the same according to Example 1 of the present invention, FIG. 1(b) is a cross-sectional view taken along line A-A in FIG. 1(a), and FIG. 1(c) is a cross-sectional view taken along line B-B in FIG. 1(a). FIG. 2 is a partial cross-sectional view taken along line B-B in FIG. 1(a).

Figure 1:
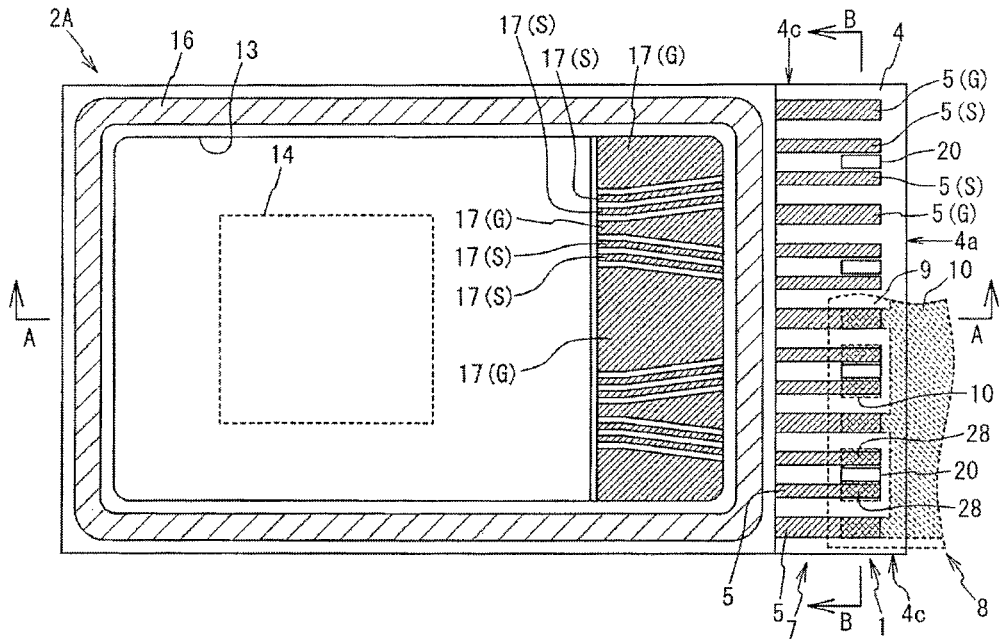
FIG. 1(*a*) is a plan view of a connection structure for a wiring substrate and a flexible substrate and a package for housing electronic components using the same according to Embodiment 1 of the present invention, FIG. 1(*b*) is a cross-sectional view taken along line A-A in FIG. 1(*a*), and FIG. 1(*c*) is a cross-sectional view taken along line B-B in FIG. 1(*a*).
Figure 1:
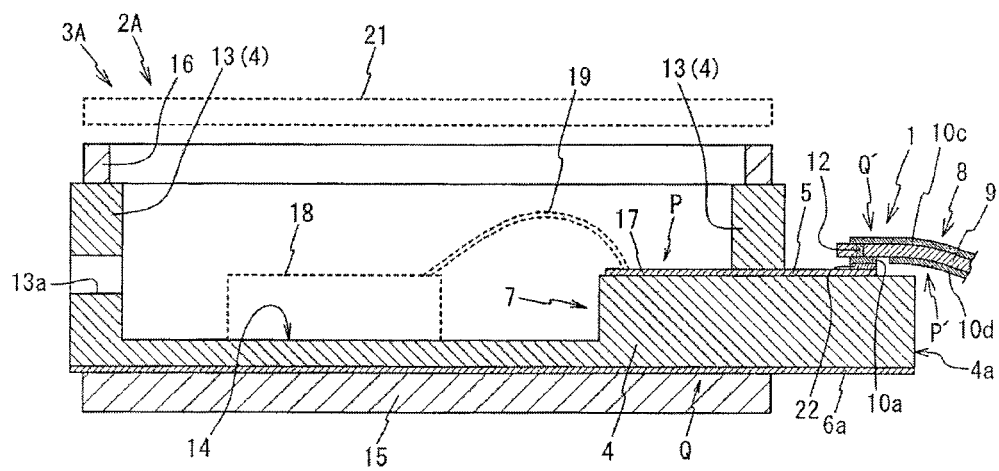
Figure 1:
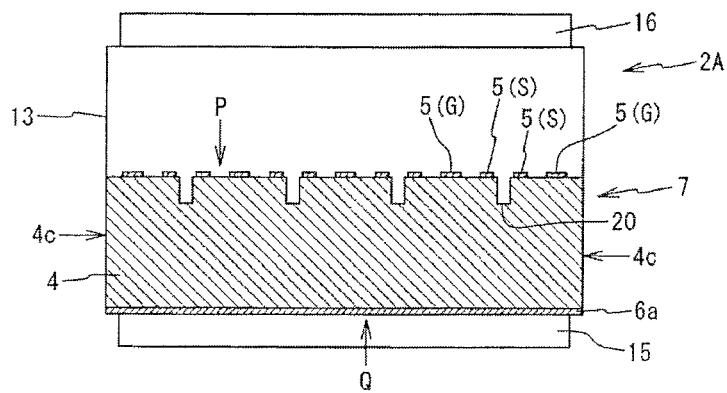
Figure 2:
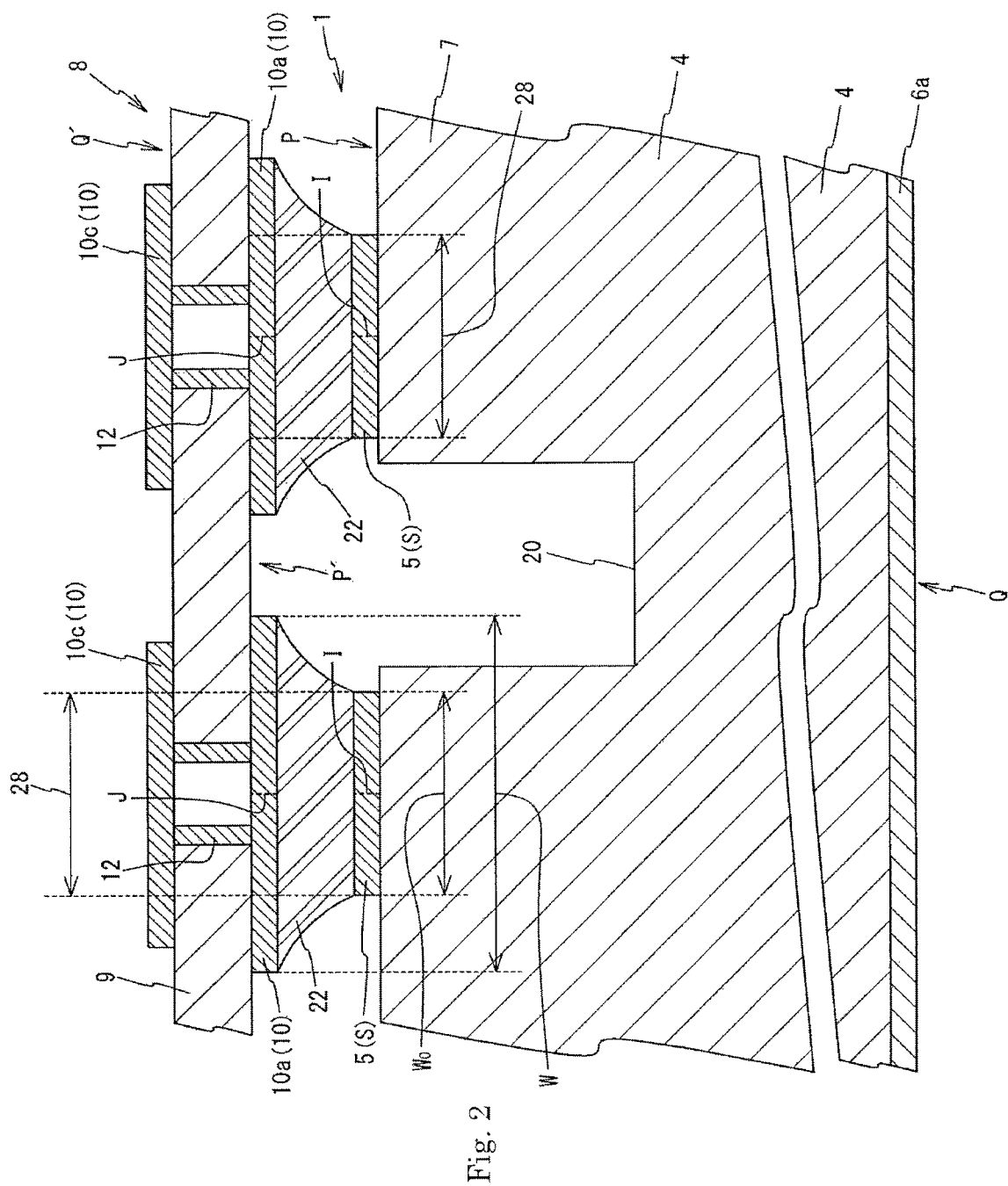
FIG. 2 is a partial cross-sectional view taken along line B-B in FIG. 1(*a*).

As shown in FIG. 1, a connection structure 1 for a wiring substrate and a flexible substrate according to Example 1 includes a wiring substrate 7 made of, for example, a ceramic single-layer substrate or a multilayer substrate, and a flexible substrate 8 connected to the wiring substrate 7 via a joining material 22.

Further, the wiring substrate 7 in the connection structure 1 for a wiring substrate and a flexible substrate includes, as shown in FIGS. 1 and 2, a ceramic insulating member 4, a conductor layer 5 provided at least on a main surface P of the insulating member 4, and a first ground region 6a provided on a back surface Q of the insulating member 4. Furthermore, there are usually two types of conductor layers 5: a signal line conductor layer 5(S) and a ground line conductor layer 5(G). FIG. 1(a) illustrates a so-called GSSG structure in which both sides of a pair of signal line conductor layers 5(S) are sandwiched between ground line conductor layers 5(G). In addition, the signal line conductor layer 5(S) and the ground line conductor layer 5(G) include, on the main surface P of the wiring substrate 7, a wire bonding pad for signal line 17(S) and a wire bonding pad for ground line 17(G), respectively. As will be described later, the wire bonding pad for signal line 17(S), the wire bonding pad for ground line 17(G), and an electronic component 18 are electrically connected by a bonding wire 19 to constitute an electronic device according to Example 2.

In addition, FIG. 1 illustrates a case where the conductor layer 5 is formed on the main surface P of the insulating member 4 as an example, but the formation position of the conductor layer 5 is not necessarily limited to only on the main surface P of the insulating member 4, but a part thereof may be provided on the inside or the back surface Q of the insulating member 4. In this case, the conductor layers 5 formed between different layers may be electrically connected by a conductive via.

Although FIG. 1 illustrates a case where the wiring substrate 7 is made of a ceramic single-layer substrate, and the first ground region 6a is formed on the back surface P of the insulating member 4 as an example, when the wiring substrate 7 is made of a ceramic multilayer substrate, the wiring substrate 7 may include a conductive layer (see an inner layer ground region 6b in FIG. 9(a) in the subsequent stage) having the same effect as that of the first ground region 6a in a layered state on the inner cross section of the insulating member 4.

Further, as shown in FIGS. 1 and 2, the flexible substrate 8 according to Example 1 includes an insulating sheet 9 made of resin (for example, made of a material such as polyimide), and a metal film 10 provided at least on a main surface P' (see FIG. 1 (b)) of the insulating sheet 9. Further, the metal film 10 is provided on the main surface P' side of the flexible substrate 8 and has a signal line pad 10a joined to the signal line conductor layer 5(S) of the wiring substrate 7 via the joining material 22. The signal line pad 10a is joined to the signal line conductor layer 5(S) of the wiring substrate 7 via the joining material 22.

In addition, the connection structure 1 for a wiring substrate and a flexible substrate according to Example 1, when the connection structure 1 for a wiring substrate and a flexible substrate is seen through from the back surface Q' side of the flexible substrate 8, includes an overlap region 28 (see a portion where hatching intersects in FIG. 1(a)) in which the signal line pad 10a of the flexible substrate 8 and the signal line conductor layer 5(S) of the wiring substrate 7 are overlapped.

Then, in the connection structure 1 for a wiring substrate and a flexible substrate according to Example 1, when the overlap region 28 is cut in a transmission direction of a high-frequency signal in the signal line conductor layer 5(S), that is, in a direction perpendicular to a longitudinal direction of the signal line conductor layer 5(S) in FIG. 1(a), in a case where the width of the signal line pad 10a belonging to the overlap region 28 is W (see FIG. 2), and the width of the signal line conductor layer 5(S) belonging to the overlap region 28 when cut in the same direction is $W_0$ (see FIG. 2), the connection structure 1 includes a useful connection portion that is a planar region including the signal line conductor layer 5(S) and the signal line pad 10a which satisfy $W_0<W$.

That is, the useful connection portion in the connection structure 1 for a wiring substrate and a flexible substrate according to Example 1 described above can also be expressed as "a planar region including the signal line conductor layer 5(S) and the signal line pad 10a which satisfy $W_0<W$, in a case where the width of the signal line pad 10a including the overlap region 28 is W (see FIG. 2) and the width of the signal line conductor layer 5(S) including the overlap region 28 when cut in the same direction is $W_0$ (see FIG. 2)".

Note that, this useful connection portion includes, for example, both of the signal line conductor layer 5(S) and the signal line pad 10a existing in the range indicated by a symbol G in FIGS. 4 (a), 5, and 6 shown later.

Here, the flexible substrate 8 in the connection structure 1 for a wiring substrate and a flexible substrate according to Example 1 will be described in detail with reference to FIG. 3.

FIG. 3(a) is a plan view seen from the main surface side of the flexible substrate according to the present invention, FIG. 3(b) is a plan view seen from the back surface side of the flexible substrate, and FIG. 3(c) is a cross-sectional view taken along line C-C in FIG. 3(b). The same portions as those described in FIG. 1 or FIG. 2 are denoted by the same reference numerals, and description of the configuration is omitted.

As shown in FIG. 3(a), the flexible substrate 8 according to Example 1 includes a ground line pad 10b made of a metal film 10 on the insulating sheet 9 main surface P' side, a second ground region 10d connected thereto, a notch 11 formed by cutting out a part of the ground line pad 10b in the vicinity of an end edge 9a of the insulating sheet 9, and a signal line pad 10a formed by making the island-shaped metal film 10 tightly adhere to the notch 11.

As in the case of the conductor layer 5 of the wiring substrate 7 described above, the flexible substrate 8 also has a so-called GSSG structure in which both sides of the pair of signal line pads 10a (metal film 10) are sandwiched by the ground line pads 10b (metal film 10).

Further, the back surface Q' side of the flexible substrate 8 includes a transmission zone 10c in which an elongated band-shaped metal film 10 is in close contact with the insulating sheet 9, as shown in FIG. 3(b). In the flexible substrate 8 according to Example 1, a through conductor 12 is provided at a portion where the signal line pad 10a or the ground line pad 10b provided on the main surface P' side of the insulating sheet 9 and the transmission zone 10c provided on the back surface Q' side of the insulating sheet 9 face each other, and the signal line pad 10a or the ground line pad 10b and the transmission zone 10c are electrically connected by the through conductor 12. Similarly, the through conductor 12 electrically connects the second ground region 10d and the transmission zone 10c disposed opposite thereto.

Similar to the conductor layer 5 described above, also the metal film 10 includes two types: a signal line metal film and a ground line metal film. Although not clearly shown in the figure, the metal film 10 connected to the signal line conductor layer 5(S) is the signal line metal film (S), and the metal film 10 connected to the ground line conductor layer 5(G) is the ground line metal film (G). Further, in the present embodiment, the metal films 10 are given different names such as a signal line pad 10a, a ground line pad 10b, and a transmission zone 10c so that they can be distinguished from each other according to their uses and functions.

Further, when the wiring substrate 7 and the flexible substrate 8 are connected, the signal line pad 10a of the flexible substrate 8 is disposed immediately above the signal line conductor layer 5(S) of the wiring substrate 7, similarly the ground line pad 10b is disposed immediately above the ground line conductor layer 5(G), and these are joined to each other by the joining material 22 to form the connection structure 1 for a wiring substrate and a flexible substrate. As a result, the conductor layer 5 of the wiring substrate 7 having the GSSG structure is electrically connected to the metal film 10 of the flexible substrate 8 having the same GSSG structure. The ground line conductor 5(G) and the ground line pad 10b are electrically connected to the first ground region 6a of the wiring substrate 7.

In this case, for example, in the state where the center line I of the signal line conductor layer 5(S) in the wiring substrate 7 and the center line J of the signal line pad 10a in the flexible substrate match each other shown in FIG. 2, the design is made so that the characteristic impedance in this portion is as designed. However, in practice, it is extremely difficult to completely match the center line I of the signal line conductor layer 5(S) with the center line J of the signal line pad 10a, and an unavoidable deviation in the width direction occurs.

Further, in the connection structure 1 for a wiring substrate and a flexible substrate according to Example 1, the signal line pad 10a and the signal line conductor layer 5(S) are capacitively coupled to the first ground region 6a in the wiring substrate 7 (see FIG. 2). Particularly, with respect to the signal line pad 10a, the portion excluding the overlap region 28, that is, the portion protruding in the width direction of the signal line conductor layer 5(S) particularly affects the capacitive coupling. Here, the planar region obtained by adding together the signal line conductor layer 5(S) and the protruding region of the signal line pad 10a protruding in the width direction of the signal line conductor layer 5(S) is defined as a "facing area" with respect to the first ground region 6a, and an effect on the capacitive coupling will be described.

The characteristic impedance of the high-frequency signal passing through the connection portion between the wiring substrate 7 and the flexible substrate 8 varies according to the capacitive coupling caused by the formation of the "facing area".

More specifically, for example, in the connection structure 1 for a wiring substrate and a flexible substrate shown in FIG. 2, when the facing area of the connection portion including the signal line pad 10a and the signal line conductor layer 5(S) to the first ground region 6a increases, the capacitive coupling of the electric field between them increases accordingly, and the characteristic impedance at this connection portion varies and is not a value as designed (as set).

Then, as the variation in the characteristic impedance with respect to the design value (set value) at the connection portion in the connection structure 1 for a wiring substrate and a flexible substrate increases, the transmission loss of the high-frequency signal at this connection portion increases.

To explain this point in more detail, for example, when the width of the signal line conductor layer 5(S) and the width of the signal line pad 10a are both equal to $W_x$, and the center lines I and J completely match each other, since the protrusion amount of the signal line pad 10a in the width direction of the signal line conductor layer 5(S) is zero, the capacitive coupling can be considered with the "facing area" with respect to the first ground region 6a as the width $W_x$ of the signal line conductor layer 5(S).

On the other hand, for example, in a case where the width of the signal line conductor layer 5(S) and the width of the signal line pad 10a are both equal to $W_x$, and when the flexible substrate 8 is connected to the wiring substrate 7, they are connected in a state in which the center lines I and J are positionally deviated by α in the width direction, the protrusion amount of the signal line pad 10a in the width direction of the signal line conductor layer 5(S) is α. In this case, the capacitive coupling needs to be considered with the "facing area" with respect to the first ground region 6a as $(W_x+\alpha)$ obtained by adding the protrusion amount a of the signal line pad 10a to the width $W_x$ of the signal line conductor layer 5(S). In this case, the "facing area" with respect to the first ground region 6a is increased by the protrusion amount a as compared with the case where the protrusion amount of the signal line pad 10a is zero.

That is, in a case where the width of the signal line conductor layer 5(S) is equal to the width of the signal line pad 10a, when a deviation occurs between the center line I of the signal line conductor layer 5(S) and the center line J of the signal line pad 10a, the "facing area" with respect to the first ground region 6a increases by an amount corresponding to the protrusion amount (same as the deviation amount between the center line I and the center line J), and accordingly, an undesired increase in capacitive coupling occurs at that portion, so that generation of a transmission loss of a high-frequency signal at the connection portion between the wiring substrate 7 and the flexible substrate 8 is unavoidable.

In view of such circumstances, in the invention disclosed in Patent Document 1, since the width of the wiring conductor (corresponding to the signal line pad 10a in the present invention) of the flexible substrate is set to 0.6 to 1 time the width of the line conductor (corresponding to the signal line conductor layer 5(S) in the present invention) formed on the dielectric (corresponding to the insulating member 4 in the present invention), even if the wiring conductor is joined to the line conductor in a deviated state, the line conductor is made difficult to protrude from the wiring conductor, and the transmission loss of the high-frequency signal at these connecting portions has been successfully reduced.

However, in the case of the invention disclosed in Patent Document 1, in order to exhibit the above effect, the width of the wiring conductor (corresponding to the signal line pad 10a in the present invention) of the flexible substrate needs to be set to be relatively narrower than the width of the line conductor (corresponding to the signal line conductor layer 5(S) in the present invention) formed on the dielectric, and the reduction in the adhesion strength of the wiring conductor on the flexible substrate has been unavoidable.

On the other hand, since the connection structure 1 for a wiring substrate and a flexible substrate according to Example 1 of the present invention includes a useful connection portion in which, as shown in FIG. 2, a size relation between the width W of the signal line pad 10a and the width $W_0$ of the signal line conductor layer 5(S) is set opposite to the case disclosed in Patent Document 1, it is possible to reliably prevent reduction in the adhesion strength of the signal line pad 10a on the flexible substrate 8 while exhibiting effects equivalent to or better than those of the invention disclosed in Patent Document 1.

Here, with reference to FIGS. 2, 4, and 5, a mechanism for exerting the function and effect of the connection structure 1 for a wiring substrate and a flexible substrate according to Example 1 of the present invention will be described in detail.

FIG. 4(a) is a partial plan view of the connection structure for a wiring substrate and a flexible substrate according to Example 1 of the present invention, and FIG. 4(b) is a cross-sectional view taken along line D-D in FIG. 4(a).

Figure 5:
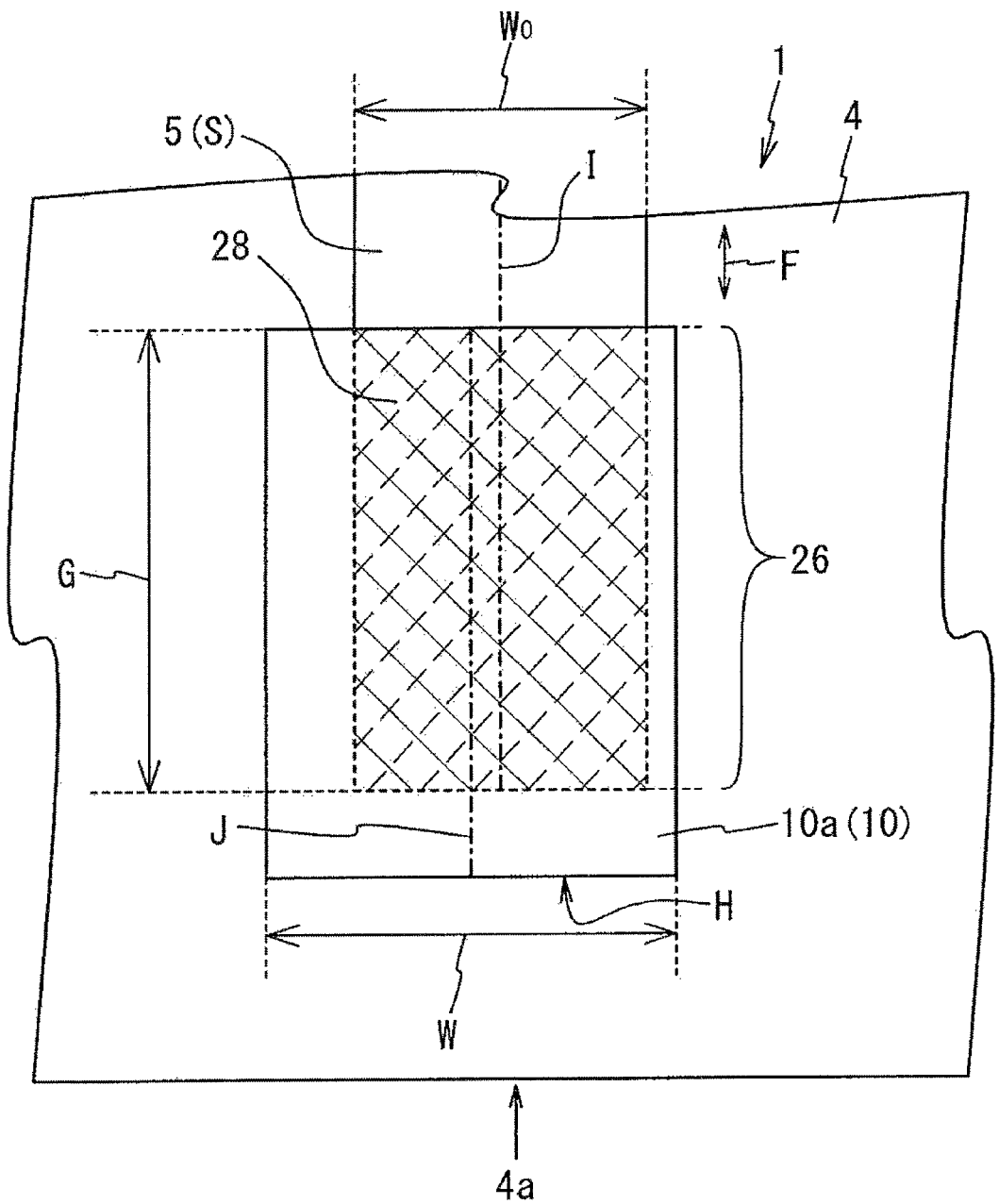
FIG. 5 is a partial plan view showing a planar shape of an overlap region and its periphery in the connection structure for a wiring substrate and a flexible substrate according to Example 1 of the present invention.

FIG. 5 is a partial plan view showing a planar shape of the overlap region and its periphery in the connection structure for a wiring substrate and a flexible substrate according to Example 1 of the present invention.

Figure 3:
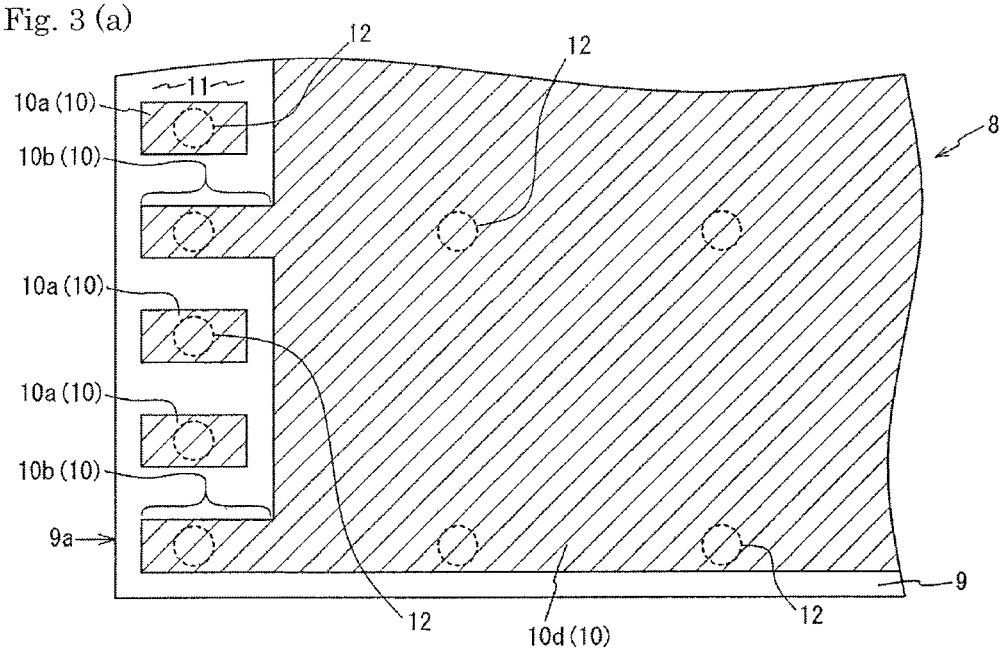
FIG. 3(*a*) is a plan view seen from a main surface side of a flexible substrate according to the present invention, FIG. 3(*b*) is a plan view seen from a back surface side of the flexible substrate, and FIG. 3(*c*) is a cross-sectional view taken along line C-C in FIG. 3(*b*).
Figure 3:
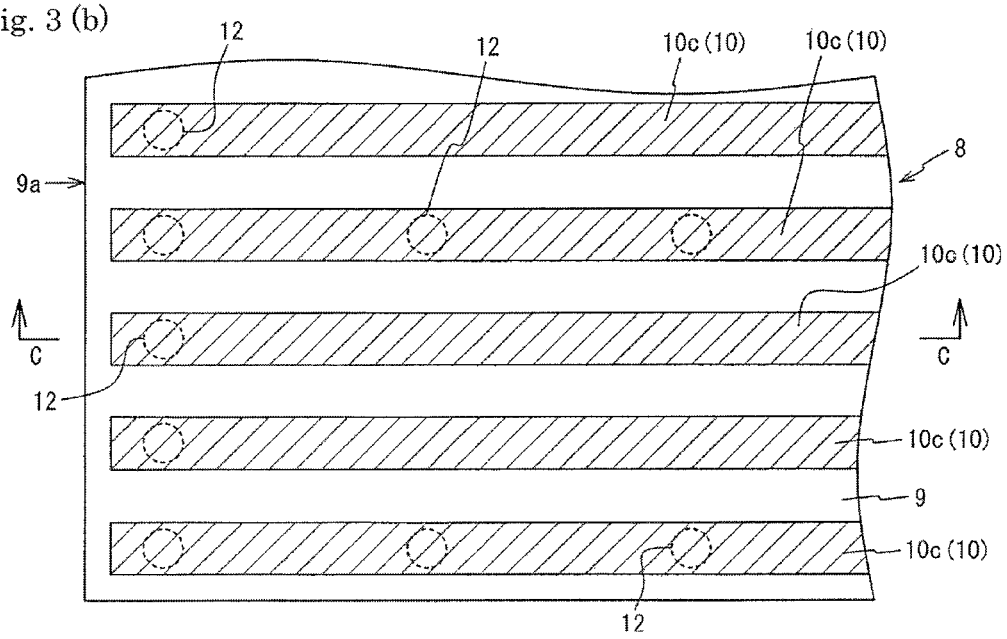
Figure 3:
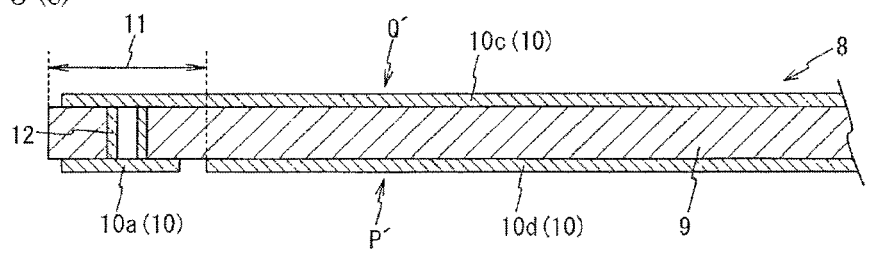

The same portions as those described in FIGS. 1 to 3 are denoted by the same reference numerals, and description of the configuration is omitted.

As shown in FIG. 4(a), the connection structure 1 for a wiring substrate and a flexible substrate according to Example 1 includes a useful connection portion in which the width W of the signal line pad 10a belonging to the overlap region 28 and the width $W_0$ of the signal line conductor layer 5(S) also belonging to the overlap region 28 satisfy $W>W_0$. More specifically, the connection structure 1 for a wiring substrate and a flexible substrate according to Example 1 includes a useful connection portion in which the width W of the signal line pad 10a including the overlap region 28 and the width $W_0$ of the signal line conductor layer 5(S) also including the overlap region 28 satisfy $W>W_0$.

Then, as shown in FIG. 4(a), in a case where the center line I of the signal line conductor layer 5(S) and the center line J of the signal line pad 10a completely match each other, the signal line conductor layer 5(S) belonging to the overlap region 28 (region where the hatching consisting of a straight line and the hatching consisting of a broken line intersect in a mesh form in FIG. 4(a)) fits completely under the signal line pad 10a belonging to the overlap region 28 in the width direction. That is, as shown in FIG. 4(a), in the width direction of both the signal line conductor layer 5(S) and the signal line pad 10a, the signal line conductor layer 5(S) whose width is $W_0$ is completely housed under the signal line pad 10a whose width is W.

In this case, the protrusion amount of the signal line pad 10a in the width direction of the signal line conductor layer 5(S) is $(W-W_0)$.

On the other hand, when the flexible substrate 8 is joined to the wiring substrate 7, even if the center line I of the signal line conductor layer 5(S) and the center line J of the signal line pad 10a are deviated from each other in the width direction (left and right direction in FIG. 5) of the signal line conductor layer 5(S), when the width W of the signal line pad 10a belonging to the overlap region 28 and the width $W_0$ of the signal line conductor layer 5(S) also belonging to the overlap region 28 satisfy the relationship of $W>W_0$, as shown in FIG. 5, the signal line conductor layer 5(S) belonging to the overlap region 28 can be made difficult to protrude from the width direction of the signal line pad 10a. That is, when the flexible substrate 8 is joined to the wiring substrate 7, even if a deviation occurs in the width direction (left and right direction in FIG. 5) of the signal line conductor layer 5(S) between the center line I of the signal line conductor layer 5(S) and the center line J of the signal line pad 10a, when the width W of the signal line pad 10a including the overlap region 28 and the width $W_0$ of the signal line conductor layer 5(S) also including the overlap region 28 satisfy the relationship of W>$W_0$, as shown in FIG. 5, the signal line conductor layer 5(S) can be made difficult to protrude in the width direction of the signal line pad 10$a$.

That is, in the connection structure 1 for a wiring substrate and a flexible substrate according to Example 1 of the present invention, when a deviation in the width direction occurs between the center line I of the signal line conductor layer 5(S) and the center line J of the signal line pad 10$a$, if the signal line conductor layer 5(S) does not protrude from the signal line pad 10$a$, the protrusion amount of the signal line pad 10$a$ in the width direction of the signal line conductor layer 5(S) remains (W−$W_0$) unchanged. In this case, since the width of the overlap region 28 does not change, the "facing area" with respect to the first ground region 6$a$ does not change.

On the other hand, when a deviation in the width direction of the signal line conductor layer 5(S) occurs between the center line I of the signal line conductor layer 5(S) and the center line J of the signal line pad 10$a$, if the signal line conductor layer 5(S) protrudes from the signal line pad 10$a$, the protrusion amount of the signal line pad 10$a$ in the width direction of the signal line conductor layer 5(S) becomes larger than (W−$W_0$). At this time, an increase amount of the protrusion amount of the signal line pad 10$a$ in the width direction of the signal line conductor layer 5(S) coincides with the decrease amount of the width of the overlap region 28.

Thus, in the connection structure 1 for a wiring substrate and a flexible substrate according to Example 1, when the wiring substrate 7 and the flexible substrate 8 are connected, as shown in FIG. 5, even if a deviation occurs between the center line I of the signal line conductor layer 5(S) and the center line J of the signal line pad 10$a$, an increase amount in the facing area of the connection portion disposed facing the first ground region 6$a$ of the wiring substrate 7 can be made to be zero, or even if it is not zero, can be reliably reduced as compared with the case where the width $W_0$ of the signal line conductor layer 5(S) is equal to the width W of the signal line pad 10$a$.

As a result, the increase of the capacitive coupling generated between the connection portion in the connection structure 1 for a wiring substrate and a flexible substrate according to Example 1 and the first ground region 6$a$ due to the deviation of the joining position of the signal line conductor layer 5(S) and the signal line pad 10$a$ can be reduced as compared with the case where the useful connection portion according to the present invention is not provided. As a result, in the connection structure 1 for a wiring substrate and a flexible substrate according to Example 1, the variation in the characteristic impedance at the connection portion between the signal line conductor layer 5(S) and the signal line pad 10$a$ can be reduced, and eventually it is possible to reduce the transmission loss of the high-frequency signal at the connection portion between the signal line conductor layer 5(S) and the signal line pad 10$a$.

In addition, in the connection structure 1 for a wiring substrate and a flexible substrate according to Example 1, when the above effect is exhibited, the width W of the signal line pad 10$a$ is always larger than the width $W_0$ of the signal line conductor layer 5(S), and thus the adhesion strength of the signal line pad 10$a$ to the insulating sheet 9 does not decrease.

Therefore, according to the connection structure 1 for a wiring substrate and a flexible substrate according to Example 1, it is possible to reliably prevent reduction in mechanical strength at the connection portion between the wiring substrate 7 and the flexible substrate 8 while improving the transmission characteristics of the high-frequency signal.

In the connection structure 1 for a wiring substrate and a flexible substrate according to Example 1, the width $W_0$ of the signal line conductor layer 5(S) in the useful connection portion is relatively narrower than the width W of the signal line pad 10$a$ also in the useful connection portion. However, as described in "Problems to be Solved by the Invention" at the beginning, since the joint strength of the signal line conductor layer 5(S) to the insulating member 4 is much larger than the adhesion strength of the metal film 10 (signal line pad 10$a$) to the insulating sheet 9, even if the width $W_0$ is relatively narrower than the width W, the reduction in the mechanical strength of the connection structure 1 for a wiring substrate and a flexible substrate according to Example 1 is not a problem.

Here, a modification of the connection structure 1 for a wiring substrate and a flexible substrate according to Example 1 of the present invention will be described with reference to FIGS. 1, 2, and 4.

As shown in FIGS. 1($a$) and 4($a$), the connection structure 1 for a wiring substrate and a flexible substrate according to Example 1 may include, as a selective component, a spot facing portion 20 having a recessed cross-sectional shape between the overlap regions 28 that form a pair when the wiring substrate 7 is viewed in plan view, as shown in FIG. 1($a$) and FIG. 2.

Further, as shown in FIGS. 1($a$) and 4($a$), the spot facing portion 20 is desirably provided at least between the starting end position and the terminating end position of the overlap region 28 when the wiring substrate 7 is seen through from the side surface 4$c$ side. In this case, the characteristic impedance between the starting end position and the terminating end position of the overlap region 28 can be made substantially constant. Note that, when seen through from the side surface 4$c$ side of the wiring substrate 7, the starting end position and the terminating end position of the overlap regions 28 forming a pair coincide with each other.

Further, the formation region of the spot facing portion 20 does not have to completely coincide with the starting end position or the terminating end position of the overlap region 28, and even if it is formed beyond the starting end position or the terminating end position of the overlap region 28, the objective effect can be exhibited.

Usually, in the connection structure for a wiring substrate and a flexible substrate, the characteristic impedance is smaller in the portion where the insulating member 4 and the insulating sheet 9 overlap than in the portion where the insulating member 4 and the insulating sheet 9 do not overlap.

The characteristic impedance is generally inversely proportional to the square root of the relative permittivity ($\varepsilon_s$) around a signal line (here, the conductor layer 5, etc.). Furthermore, since the relative permittivity ($\varepsilon_s$) of the insulating sheet 9 made of resin is larger than the relative permittivity of air, the characteristic impedance is smaller in the portion where the insulating member 4 and the insulating sheet 9 are close to each other in the high-frequency signal transmission path than in the portion where the insulating sheet 9 is not disposed in close proximity.

Therefore, in the connection structure 1 for a wiring substrate and a flexible substrate according to a modification of Example 1, the insulating member 4 includes the spot facing portion 20 in parallel with the overlap region 28 and having at least the same length as the overlap region 28, and therefore, a part of the insulating member 4 can be replaced with air.

This can relatively increase the volume of air around the connection portion between the wiring substrate 7 and the flexible substrate 8, and thereby the characteristic impedance at the connection portion can be increased.

As a result, the characteristic impedance at the connection portion between the wiring substrate 7 and the flexible substrate 8 can be brought close to the design value (set value). Then, this can make it possible to reduce the transmission loss that occurs when a high-frequency signal is transmitted to the connection structure 1 for a wiring substrate and a flexible substrate according to the modification of Example 1 as compared with the case where the spot facing portion 20 is not provided.

Note that the width and depth of the spot facing portion 20 formed on the insulating member 4 may be freely set, but it is desirable that both the width and depth of the spot facing portion 20 be uniform (including concept of being substantially uniform).

In addition, in order to form the spot facing portion 20 having the dimensions necessary for adjusting the characteristic impedance on the insulating member 4 of the wiring substrate 7 by laser processing, the interval between the signal line conductor layers 5(S) that form a pair and belong to the overlap region 28, that is, the insulation distance, must be at least 100 μm or more. That is, in order to form the spot facing portion 20 having the dimensions necessary for adjusting the characteristic impedance on the insulating member 4 of the wiring substrate 7 by laser processing, the interval between the signal line conductor layers 5(S) forming a pair, that is, the insulation distance, must be at least 100 μm or more.

If the interval between the signal line conductor layers 5(S) belonging to the overlap region 28 is smaller than 100 μm, when the spot facing portion 20 is formed by laser processing, the signal line conductor layer 5(S) may be damaged by laser.

In other words, if the interval between the paired signal line conductor layers 5(S) is smaller than 100 μm, when the spot facing portion 20 is formed by laser processing, the signal line conductor layer 5(S) may be damaged by laser.

Further, in the connection structure 1 for a wiring substrate and a flexible substrate according to the modification of Example 1 described above, the upper limit value of the width W of the signal line pad 10a in the useful connection portion is set to ($W_0$+3δ) when the deviation tolerance of the center line J of the signal line pad 10a with respect to the center line I of the signal line conductor layer 5(S) is δ, and thereby, in association with the effect obtained by including the spot facing portion 20, the design value (set value) of the characteristic impedance at the connection portion between the wiring substrate 7 and the flexible substrate 8 can be set to a general characteristic impedance design value (for example, 100Ω) in this technical field.

In other words, when the insulating member 4 does not include the spot facing portion 20, the characteristic impedance at the connection portion between the wiring substrate 7 and the flexible substrate 8 may not be designed (set) to a general set value in this technical field, and in some cases, the transmission loss of a high-frequency signal at the connection portion between the wiring substrate 7 and the flexible substrate 8 cannot be reduced.

On the other hand, according to the connection structure 1 for a wiring substrate and a flexible substrate according to the modification of Example 1, compared with the case where the insulating member 4 does not include the spot facing portion 20, there is an effect of facilitating the design and production of products having a low transmission loss of a high-frequency signal at the connection portion between the wiring substrate 7 and the flexible substrate 8.

In addition, if the width W of the signal line pad 10a is larger than the width $W_0$ of the signal line conductor layer 5(S), the characteristic impedance decreases in the overlap region 28, and it may be difficult to bring the characteristic impedance at that portion close to the design value along with decrease in the characteristic impedance due to proximity of the insulating sheet 9 to the insulating member 4 described above. This state is a state in which the width W of the signal line pad 10a is unnecessarily larger than the width $W_0$ of the signal line conductor layer 5(S), that is, a state in which the facing area is too large when the center line I of the signal line conductor layer 5(S) and the center line J of the signal line pad 10a coincide with each other. Furthermore, when the width W of the signal line pad 10a exceeds ($W_0$+3δ), there is a case where it becomes difficult to bring the characteristic impedance at that portion close to the design value even if the spot facing portion 20 is provided between the paired overlap regions 28.

In particular, in the connection structure 1 for a wiring substrate and a flexible substrate according to the modification of Example 1 described above, when the lower limit value of the width W of the signal line pad 10a in the useful connection portion is specified as ($W_0$+2δ), even if the center line I of the signal line conductor layer 5(S) and the center line J of the signal line pad 10a are deviated to the full deviation tolerance δ in the width direction during the manufacture of the actual product, the variation in the characteristic impedance at the connection portion between the wiring substrate 7 and the flexible substrate 8 in the actual product can be made smaller than when the width W of the signal line pad 10a is W<($W_0$+2δ), and can be approximated to the desired design value in this technical field. This is because, if the deviation amount between the center line I of the signal line conductor layer 5(S) and the center line J of the signal line pad 10a is within the range of the deviation tolerance δ, the signal line conductor layer 5 (S) does not protrude in the width direction of the signal line pad 10a, and the facing area does not vary.

Therefore, in the connection structure 1 for a wiring substrate and a flexible substrate according to the modification of Example 1 described above, when the width W of the signal line pad 10a in the useful connection portion described above is particularly specified as ($W_0$+2δ)≤W≤($W_0$+3δ), there is an effect that it is possible to provide a high-performance product having a very little transmission loss of a high-frequency signal at the connection portion between the wiring substrate 7 and the flexible substrate 8.

In the connection structure 1 for a wiring substrate and a flexible substrate according to the present embodiment, the deviation tolerance δ between the center line I of the signal line conductor layer 5(S) and the center line J of the signal line pad 10a is preferably 60 μm or less. When the deviation tolerance δ between the center line I of the signal line conductor layer 5(S) and the center line J of the signal line pad 10a exceeds 60 μm, the width W of the signal line pad 10a satisfying ($W_0$+2δ)≤W≤($W_0$+3δ) becomes too large relative to the dimensions of the respective components constituting the wiring substrate 7, and it becomes difficult to provide the signal line conductor layer 5(S) and the signal line pad 10a at a narrow interval while bringing the characteristic impedance close to the desired design value in this technical field. Further, in order to reduce the deviation tolerance δ to 60 μm or less, it can be achieved by using a device for a manufacturing apparatus and a manufacturing process, for example, by sandwiching a solder foil as the joining material 22 between the signal line pad 10a and the signal line conductor layer 5(S), and using a device that performs thermocompression while pressing the flexible substrate with a heater member.

Furthermore, a connection structure for a wiring substrate and a flexible substrate according to another modification of Example 1 will be described with reference to FIG. 6.

Figure 6:
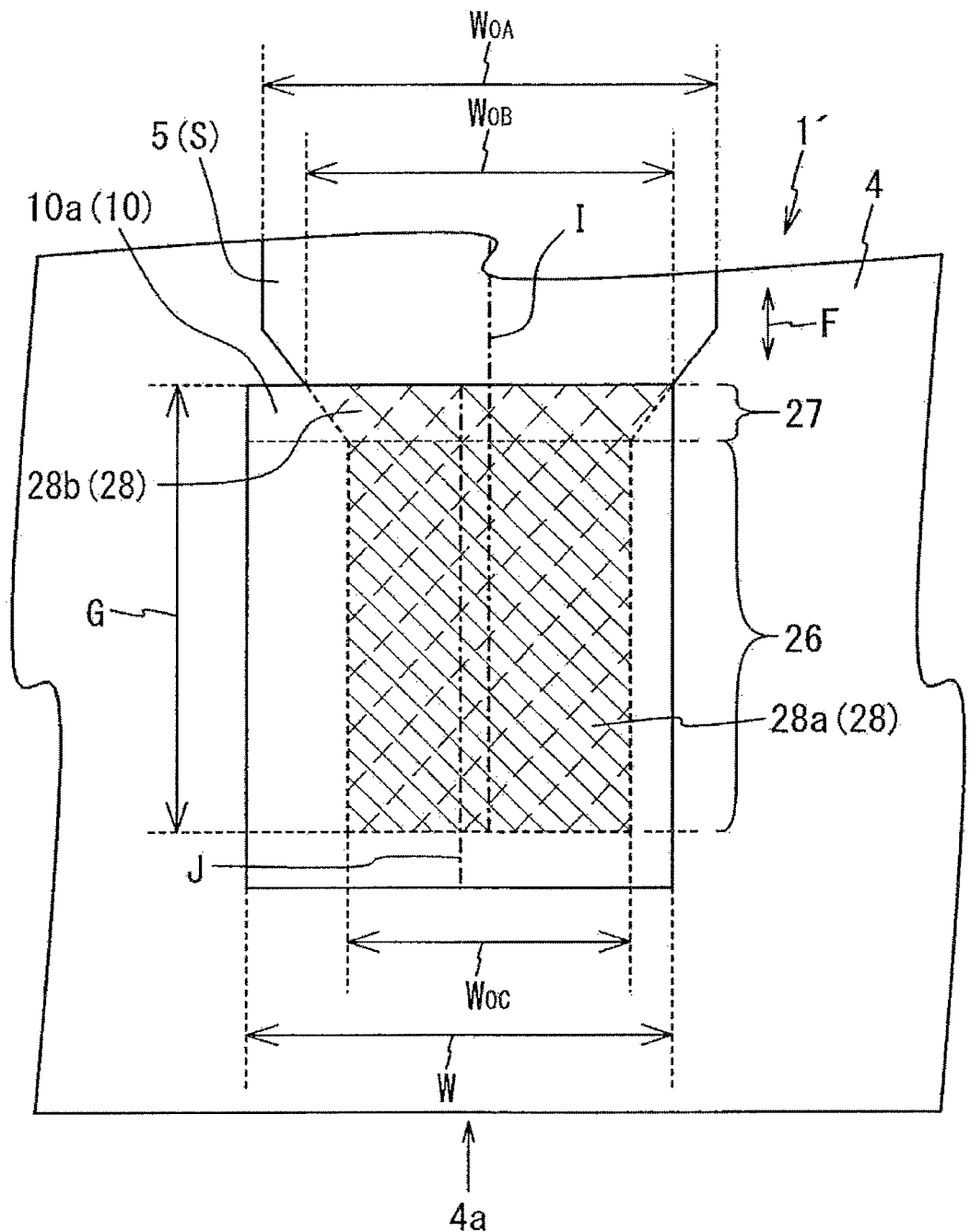
FIG. 6 is a partial plan view showing a planar shape of an overlap region and its periphery in a connection structure for a wiring substrate and a flexible substrate according to another modification of Example 1 of the present invention.

FIG. 6 is a partial plan view showing a planar shape of an overlap region and its periphery in the connection structure for a wiring substrate and a flexible substrate according to another modification of Example 1 of the present invention. The same portions as those described in FIGS. 1 to 5 are denoted by the same reference numerals, and description of the configuration is omitted.

Although in FIGS. 1 and 2 and FIGS. 4 and 5, the description has been made by taking a case where the width of the signal line conductor layer 5(S) in the signal transmission direction (see a symbol F in FIG. 4(a) and FIG. 5) is uniform (including concept of being substantially uniform) as an example, as shown in FIG. 6, the width of the signal line conductor layer 5(S) belonging to the overlap region 28 may not necessarily be uniform. That is, the width of the signal line conductor layer 5(S) forming the overlap region 28 may not necessarily be uniform.

More specifically, the signal line conductor layer 5(S) according to another modification of Example 1 shown in FIG. 6 includes a portion whose width is $W_{OA}$, a portion whose width is $W_{OC}$, and a connecting portion thereof. Further, as shown in FIG. 6, the signal line pad 10a is disposed so as to cover the entire region of portions where the width of the signal line conductor layer 5(S) is $W_{OC}$ and a part of the connecting portion of the portion where the width is $W_{OA}$, and the portion where the width is $W_{OC}$.

In FIG. 6, a useful connection portion 26 including an overlap region 28a in which the width of the signal line conductor layer 5(S) is $W_{OC}$ and more precise lattice-shaped hatching is applied occupies 50% or more of the length G of the overlap region 28 (the overlap region 28a and an overlap region 28b) in the direction parallel to the signal transmission direction F in the overlap region 28 (the overlap region 28a and the overlap region 28b).

On the other hand, in FIG. 6, a connecting portion 27 which includes the overlap region 28b having a rougher hatching than the overlap region 28a included in the useful connection portion 26, and in which the width of the signal line conductor layer 5(S) changes from $W_{OB}$ to $W_{OC}$ also corresponds to a useful connection portion of the present invention because the width $W_{OC}$ and the width $W_{OB}$ of the signal line conductor layer 5(S) are both smaller than the width W of the signal line pad 10a.

By the way, since the connecting portion 27 does not occupy 50% or more of the length G of the overlap region 28 (the overlap region 28a and the overlap region 28b) in the direction parallel to the signal transmission direction F of the overlap region 28 (the overlap region 28a and the overlap region 28b), if the useful connection portion 26 does not correspond to the useful connection portion, that is, if the width $W_{OC}$ of the signal line conductor layer 5(S) in the connection portion 26 is equal to or larger than the width W of the signal line pad 10a, the effect of reducing the transmission loss of a high-frequency signal, which is an advantageous effect of the present invention, is hardly exhibited.

On the other hand, even if the useful connection portion 26 does not correspond to the useful connection portion as described above in FIG. 6, when the connecting portion 27 occupies 50% or more, more preferably 80% or more of the length G of the overlap region 28 (the overlap region 28a and the overlap region 28b) in the direction parallel to the signal transmission direction F of the overlap region 28 (the overlap region 28a and the overlap region 28b) (not shown), the effect of reducing the transmission loss of a high-frequency signal, which is an advantageous effect of the present invention, can be exhibited. In this case, it can be said that the connecting portion 27 is a useful connection portion according to the present invention.

Therefore, a connection structure 1' for a wiring substrate and a flexible substrate according to another modification of Example 1 as shown in FIG. 6 is particularly excellent in high-frequency signal transmission characteristics for the following reason.

Although in the signal line conductor layer 5(S), in the region belonging to the overlap region 28, the flexible substrate 8 is placed on the signal line conductor layer 5(S), since the distance from the edge of the signal line pad 10a to the end edge 9a of the insulating sheet 9 is short (see FIGS. 3(a) to 3(c)), in most of the signal line conductor layer 5(S) in the region not belonging to the overlap region 28, the flexible substrate 8 does not exist on the signal line conductor layer 5(S), and only air exists. In this case, the characteristic impedance is relatively high in the signal line conductor layer 5(S) of the region not belonging to the overlap region 28. Therefore, in order to approximate the characteristic impedance of the signal line conductor layer 5(S) having a width of $W_{OC}$ and forming the useful connection portion 26 to the characteristic impedance of the signal line conductor layer 5(S) of the region having a width of $W_{OA}$ and not belonging to the overlap region 28, it is effective to lower the characteristic impedance by setting the width $W_{OA}$ to be larger than the width $W_{OC}$.

That is, in the signal line conductor layer 5(S), in the region where the overlap region 28 is formed, the flexible substrate 8 is disposed on the signal line conductor layer 5(S), but the distance from the edge of the signal line pad 10a to the end edge 9a of the insulating sheet 9 is short (see FIGS. 3(a) to 3(c)). For this reason, in most signal line conductor layers 5(S) having no overlap region 28 formed therein, the flexible substrate 8 does not exist on the signal line conductor layer 5(S), and air simply exists. In this case, the characteristic impedance is relatively high in the signal line conductor layer 5(S) of the region where the overlap region 28 is not formed. Therefore, in order to approximate the characteristic impedance of the signal line conductor layer 5(S) having a width of $W_{OC}$ and forming the useful connection portion 26 to the characteristic impedance of the signal line conductor layer 5(S) of the region having a width of $W_{OA}$ and not forming the overlap region 28, it is effective to lower the characteristic impedance by setting the width $W_{OA}$ to be larger than the width $W_{OC}$.

Further, when the width of the signal line conductor layer 5(S) is abruptly changed from $W_{OA}$ to $W_{OC}$, the above-described variation in the "facing area" occurs, and the characteristic impedance is undesirably changed. For this reason, in the connection structure 1' for a wiring substrate and a flexible substrate according to another modification of Example 1 shown in FIG. 6, the wiring substrate 7 and the flexible substrate 8 are arranged and connected so that the width of the signal line conductor layer 5(S) is continuously changed from $W_{OA}$ to $W_{OC}$, and the overlap region 28 is formed in the transition region of the width of the signal line conductor layer 5(S).

As a result, in the connection structure 1' for a wiring substrate and a flexible substrate according to another modification of Example 1 shown in FIG. 6, an abrupt change in the characteristic impedance in the region where the width of the signal line conductor layer 5(S) changes from $W_{OA}$ to $W_{OC}$ is suppressed, and deterioration of transmission characteristics of a high-frequency signal in this portion can be appropriately prevented.

Here, a modification of the planar shape of the signal line pad 10a will be described with reference to FIG. 7.

Figure 7:
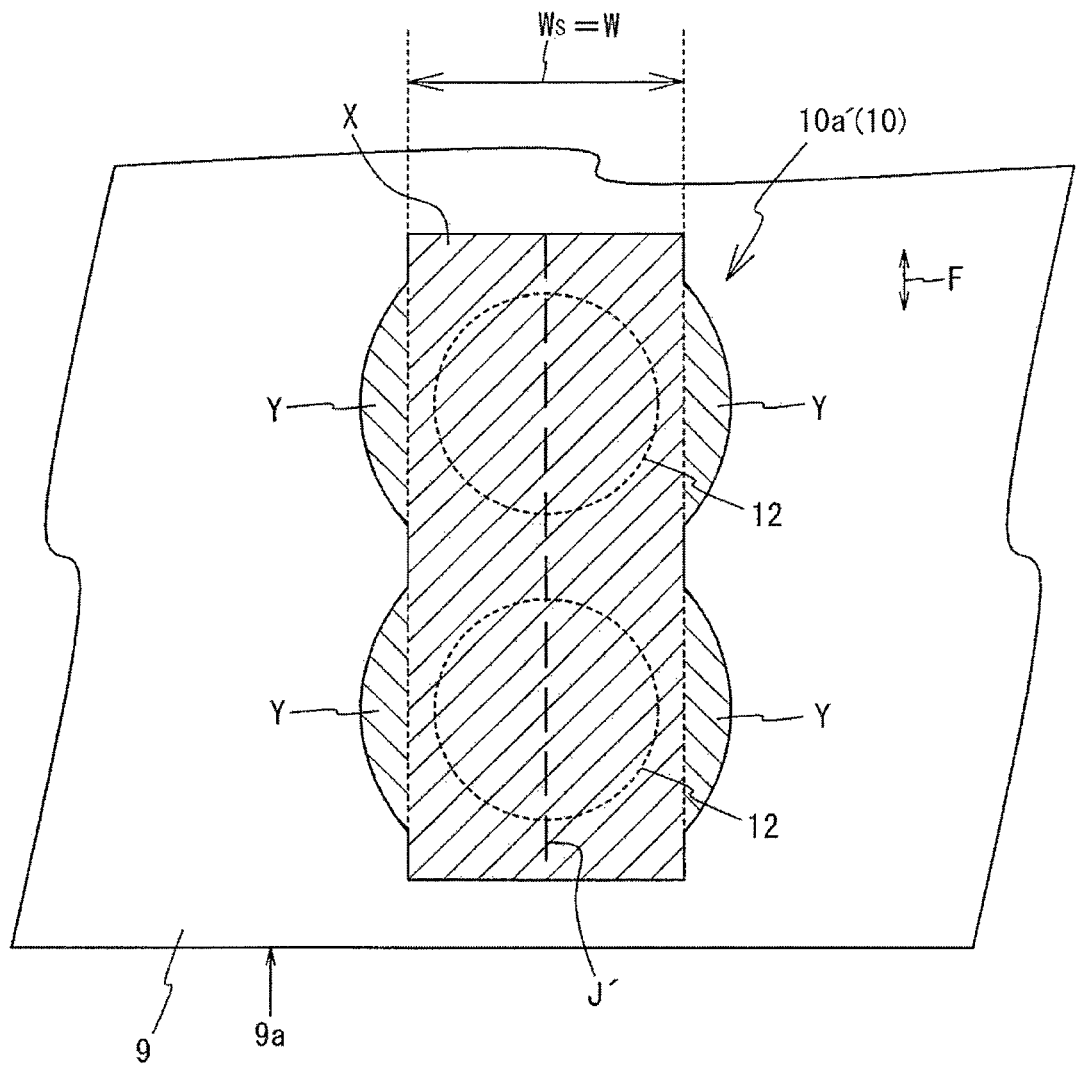
FIG. 7 is a plan view showing a modification of a signal line pad of the flexible substrate according to Example 1 of the present invention.

FIG. 7 is a plan view showing a modification of the signal line pad of the flexible substrate according to Example 1 of the present invention. The same portions as those described in FIGS. 1 to 6 are denoted by the same reference numerals, and description of the configuration is omitted.

The planar shape of the signal line pad 10a of the flexible substrate 8 according to Example 1 and its modification need not be a simple rectangular shape as shown in FIGS. 1, 3, and 4 to 6, but it may have a planar shape formed by combining a rectangular shape as shown in FIG. 7 with another shape.

More specifically, as shown in FIG. 7, a signal line pad 10a' according to the modification may include a main region X in which a width in the direction perpendicular to the signal transmission direction F is $W_s$, the planar shape thereof is substantially rectangular, the occupation ratio in the entire region of the signal line pad 10a' is greater than 80%, and the width $W_s$ is W, and a sub-region Y which is integrally connected to the main region X and located outside the main region X.

In a case where the flexible substrate 8 includes the signal line pad 10a' according to the modification shown in FIG. 7, when the through conductor 12 (via conductor) is formed on the insulating sheet 9 and then the signal line pad 10a' made of the metal film 10 is formed at the time of manufacturing the flexible substrate 8, even if an unavoidable deviation occurs at the formation position of the through conductor 12, it is possible to appropriately prevent a peripheral border of the through conductor 12 from protruding from the signal line pad 10a'.

Since the through conductor 12 is formed by depositing a plating film on the inner side surface of a through hole provided in the insulating sheet 9, the through hole is reliably covered (closed) by the signal line pad 10a', and thereby it is possible to prevent problems such as impurities entering the through hole formed in the central portion of the through conductor 12.

In addition, in a case where the flexible substrate 8 includes the signal line pad 10a' according to the modification as illustrated in FIG. 7, since, in the portion including the sub-region Y, the difference from the width $W_O$ of the signal line conductor layer 5(S) becomes locally larger, when the flexible substrate 8 is connected to the wiring substrate 7, even if a deviation occurs between the center line I of the signal line conductor layer 5(S) and a center line J' (see FIG. 7) of the main region X having a substantially rectangular shape, the increase amount in the facing area of the useful connection portion with respect to the first ground region 6a can be reduced compared with the case where the signal line pad 10a not including the sub-region Y is provided.

As a result, according to the signal line pad 10a' according to the modification, compared with the case where the signal line pad 10a not including the sub-region Y is provided, the transmission loss of the high-frequency signal generated at the connection portion between the wiring substrate 7 and the flexible substrate 8 can be reduced.

Next, selective components in the wiring substrate 7 will be described in detail with reference to FIGS. 1 and 8.

Figure 8:
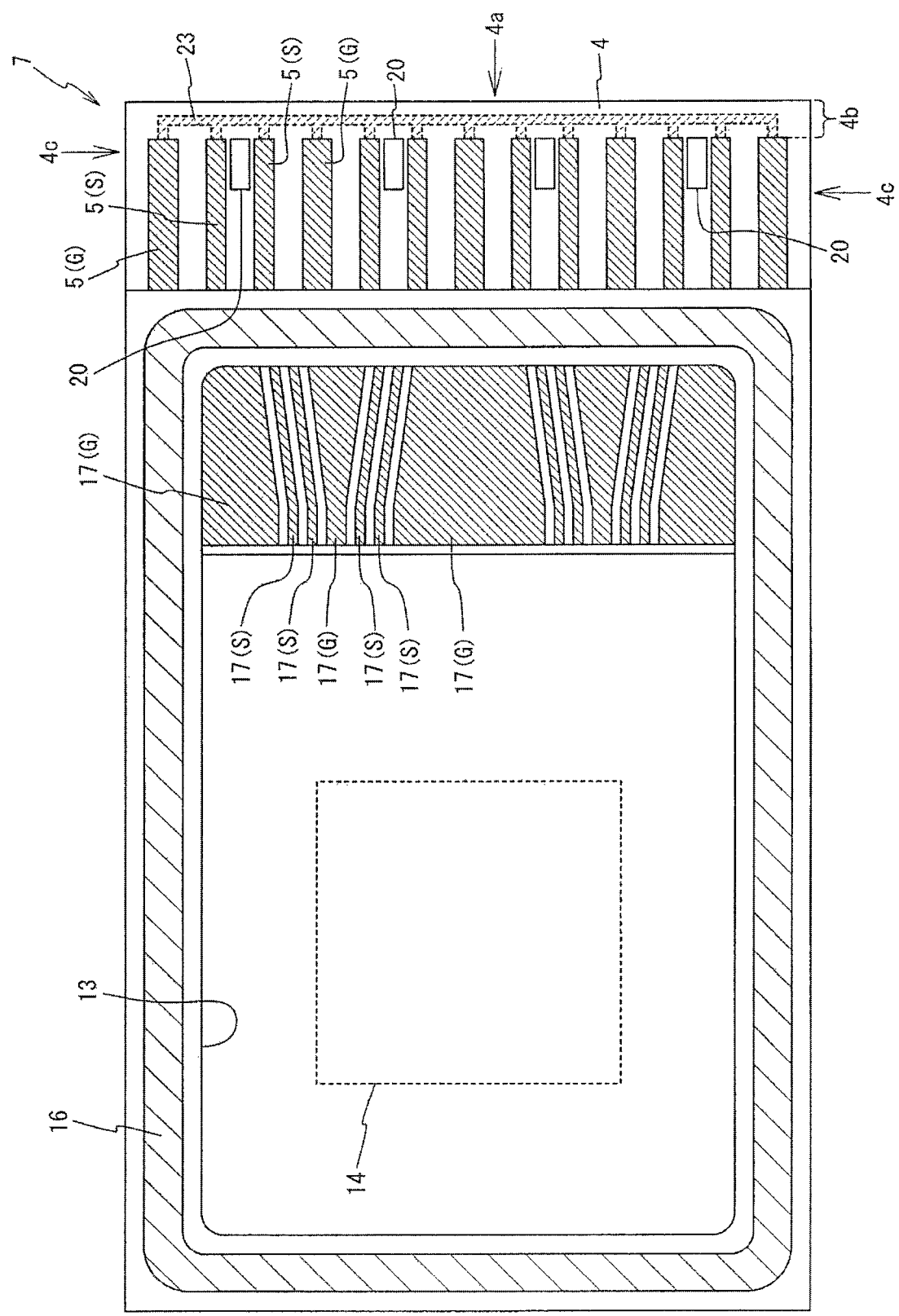
FIG. 8 is a plan view of a wiring substrate according to a modification of Example 1 of the present invention.

FIG. 8 is an enlarged view of the connection structure 1 for a wiring substrate and a flexible substrate shown in FIG. 1(a). The same portions as those described in FIGS. 1 to 7 are denoted by the same reference numerals, and description of the configuration is omitted.

As shown in FIGS. 1 and 8, in the connection structure 1, 1' for a wiring substrate and a flexible substrate according to Example 1 or its modification, the insulating member 4 of the wiring substrate 7 may include, as a selective component, a non-formation region 4b that does not include the conductor layer 5 on its main surface P side, has a substantially flat surface shape, has a strip shape, and is formed along the end surface 4a of the insulating member 4.

Since the wiring substrate 7 includes the non-formation region 4b in this way, a plating wiring 23 for forming a plating layer on the surface of each conductor layer 5 in the non-formation region 4b at the time of manufacturing the wiring substrate 7 can be temporarily formed. Note that, the plating wiring 23 shown in FIG. 8 does not exist in the final product because it is removed by mechanical polishing, laser irradiation, or the like after the plating film is formed on the surface of the conductor layer 5.

Further, as a method of forming a plating film on the surface of the conductor layer 5, there are mainly an electrolytic plating method and an electroless plating method. In the former case, since the wiring substrate 7 includes the plating wiring 23, the plating film can be formed more efficiently than in the latter case.

That is, when the electrolytic plating process is performed on the wiring substrate 7 not including the non-formation region 4b and the plating wiring 23, since a plurality of conductor layers 5(S) and 5(G) cannot be electrically connected to each other, it is necessary to connect a plating electrode to each conductor layer 5(S), 5(G). In this case, the connection work of the plating electrode is extremely complicated, and if there is a connection error of the plating electrode, etc., the conductor layer 5 not including the plating film may be generated, and the product cannot be produced efficiently.

Further, when the plating layer is formed by the electrolytic plating method, the plating film can be formed in a short time, and the adhesion strength of the plating film to the conductor layer 5 can be increased. On the other hand, the latter electroless plating method can form a plating film even if the baked wiring substrate 7 does not include the plating wiring 23, but it has such demerits that the adhesion strength of the plating film formed on the conductor layer 5 is lower than that by the electrolytic plating method, and it takes a longer time to form the plating film.

Therefore, according to the wiring substrate 7 according to the modification of Example 1, since the insulating member 4 includes the non-formation region 4b, a plating film can be formed on the surface of the conductor layer 5 by the electrolytic plating process. In this case, it is possible to rapidly form a plating film having excellent adhesion strength as compared with the case where the electroless plating process is performed.

The fact that the wiring substrate 7 includes the non-formation region 4b on the main surface side means that the non-formation region 4b in the insulating member 4 does not have the spot facing portion 20 and has a flat surface shape (including concept of substantially flat surface shape). In addition, the description that the non-formation region 4b "has a flat surface shape" means a flat state that is realized by not forming positively irregularities in the non-formation region 4b of the insulating member 4 except for the unavoidable irregularities occurring at the time of manufacturing the insulating member 4.

In addition, since the wiring substrate 7 includes the non-formation region 4b as described above, when the insulating member 4 includes the spot facing portion 20, it is possible to bring about a state in which the end of the spot facing portion 20 does not reach the end surface 4a of the insulating member 4. For this reason, at the time of manufacturing the wiring substrate 7, it is possible to appropriately prevent the product from being defective due to cracks or breaches occurring in the insulating member 4 starting from the end of the spot facing portion 20.

Therefore, when the wiring substrate 7 includes the non-formation region 4b, it is possible to efficiently produce a non-defective and difficult to break wiring substrate 7.

Figure 14:
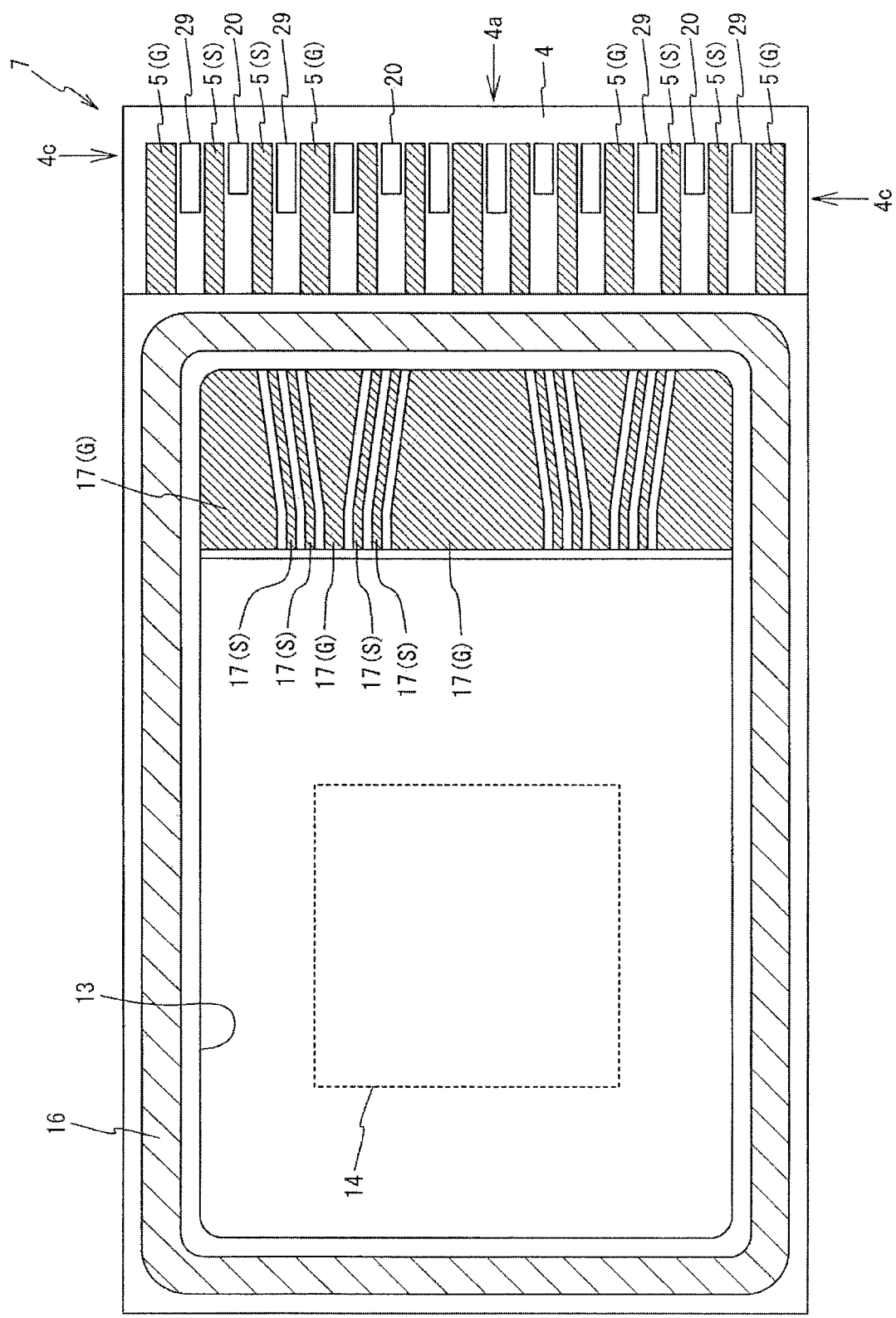
FIG. 14 is a plan view of a connection structure for a wiring substrate and a flexible substrate according to another modification of Example 1.

FIG. 14 is a plan view of a connection structure for a wiring substrate and a flexible substrate according to another modification of Example 1. The same portions as those described in FIGS. 1 to 8 are denoted by the same reference numerals, and description of the configuration is omitted.

As shown in FIG. 14, the wiring substrate 7 according to another modification of Example 1 may include, in addition to the spot facing portion 20 provided between the signal line conductor layers 5(S), another spot facing portion 29 between the signal line conductor layer 5(S) and the ground line conductor layer 5(G) (selective component).

Further, the spot facing portion 29 formed on the wiring substrate 7 according to another modification of Example 1 has an effect of increasing the characteristic impedance of the connection structure 1 for a wiring substrate and a flexible substrate (see previous FIGS. 1 and 2), as with the spot facing portion 20.

In the wiring substrate 7 according to Example 1 and its modification as described above, even if it includes the spot facing portion 20 having the maximum dimension (length, width, depth) that can be formed, the characteristic impedance in the connection structure 1 for a wiring substrate and a flexible substrate may not meet the desired design value in the technical field. In such a case, when the wiring substrate 7 includes the spot facing portion 29 in addition to the spot facing portion 20, it is possible to exhibit an effect of increasing the characteristic impedance in the connection structure 1 for a wiring substrate and a flexible substrate and making the characteristic impedance equal to or close to the design value desired in the technical field.

Note that, the dimensions of the spot facing portion 29 formed on the wiring substrate 7 according to another modification of Example 1 are not necessarily the same as the dimensions (length, width, depth) of the spot facing portion 20, and may be set to arbitrary dimensions so as to make the characteristic impedance in the connection structure 1 for a wiring substrate a flexible substrate equal to or infinitely close to the design value.

In the GSSG structure, all the configurations related to the GSSG structure need to be arranged so as to be line-symmetric with respect to a center line (not shown) existing in the middle of the pair of signal line conductor layers 5(S). Therefore, when the wiring substrate 7 according to another modification of Example 1 includes the spot facing portion 29 in addition to the spot facing portion 20, a pair of spot facing portions 29 having the same dimensions (length, width, depth) need to be formed so as to be line-symmetric with respect to the center line between the signal line conductor layers 5(S) and the ground line conductor layers 5(G) in a set of GSSG structures, respectively.

Note that, in the wiring substrate 7 according to another modification of Example 1, in a case where the length, width, and depth of the spot facing portion 29 are not line symmetric with respect to the center line, when signals having opposite phases are transmitted to each of the signal line conductor layers 5(S) forming a pair and these are used as differential lines, there is a problem that the signals transmitted to the differential lines do not have opposite phases.

Example 2

A package for housing electronic components and an electronic device using the same according to Example 2 will be described in detail with reference to FIGS. 1 to 9.

Further, a package for housing electronic components according to Example 2 is a package for housing electronic components including the connection structure for a wiring substrate and a flexible substrate according to Example 1 described above (including a plurality of types of modifications). Here, a case of including the connection structure 1 for a wiring substrate and a flexible substrate according to Example 1 is described as an example.

As shown in FIGS. 1(a) to 1(c), a package 2A for housing electronic components according to Example 2 includes the connection structure 1 for a wiring substrate and a flexible substrate according to Example 1, the electronic component mounting portion 14 provided on the main surface P of the wiring substrate 7, and the frame portion 13 provided so as to surround the electronic component mounting portion 14.

Further, in the package 2A for housing electronic components according to Example 2, the signal line conductor layer 5(S) and the ground line conductor layer 5(G) respectively include, on the main surface P of the wiring substrate 7, a wire bonding pad for signal line 17(S) and a wire bonding pad for ground line 17(G).

Furthermore, the package 2A for housing electronic components according to Example 2 includes the wire bonding pad for signal line 17(S) and the wire bonding pad for ground line 17(G) on the main surface P of the wiring substrate 7, which are electrically connected to the signal line conductor layer 5(S) and the ground line conductor layer 5(G), respectively.

In the package 2A for housing electronic components shown in FIG. 1, the wiring substrate 7 forms a part of the frame portion 13. That is, as shown in FIG. 1, the entire frame portion 13 may be made of the insulating member 4 and integrated with the wiring substrate 7, or only a part of the frame portion 13 may be made of the insulating member 4 and integrated with the wiring substrate 7, and the remainder of the frame portion 13 may be a metal material. Further, the package 2A for housing electronic components shown in FIG. 1 is configured such that the connection structure 1 for a wiring substrate and a flexible substrate according to Example 1 is disposed outside the frame portion 13.

Furthermore, the package 2A for housing electronic components according to Example 2 may include a metal ring 16 made of metal at the upper end of the frame portion 13 as a selective component as shown in FIG. 1(b). In this case, there is an effect that a lid 21 made of metal can be easily joined to an opening of the frame portion 13 by seam welding.

In addition, the package 2A for housing electronic components according to Example 2, as shown in FIGS. 1(b) and 1(c), may include a heat sink 15, which is a selective component, on the first ground region 6a provided on the back surface Q side of the wiring substrate 7. In this case, the first ground region 6a can also be used as a joining base of the heat sink 15. Further, since the package 2A for housing electronic components includes the heat sink 15 which is a selective component, heat dissipation when the electronic component 18 is mounted on the electronic component mounting portion 14 can be improved. In this case, the heat dissipation of the package 2A for housing electronic components according to Example 2 can be improved, and occurrence of problems such as malfunction and damage of the electronic component 18 can be appropriately prevented.

According to the package 2A for housing electronic components according to Example 2 as described above, since it includes the connection structure for a wiring substrate and a flexible substrate according to Example 1 described above or its modification, it is possible to provide a package for housing electronic components in which a transmission loss of a high-frequency signal hardly occurs at the connection portion between the wiring substrate 7 and the flexible substrate 8.

Also, as shown in FIG. 1(b), an electronic device 3A according to Example 2 is obtained by mounting the electronic component 18 on the electronic component mounting portion 14 of the package 2A for housing electronic components according to Example 2 described above, electrically connecting the electronic component 18 and the wire bonding pad 17 extended to the conductor layer 5 by the bonding wire 19, and further sealing the space in the frame portion 13 with the metal lid 21 while maintaining the airtight state.

In such an electronic device 3A according to Example 2, the lid 21 may be joined directly to the frame portion 13, or the lid 21 may be joined via the metal ring 16 as shown in FIG. 1(b).

Furthermore, in the electronic device 3A according to Example 2, when the frame portion 13 includes a through hole 13a that is a selective component, for example, a coaxial cable or the like is inserted into the through hole 13a to connect the electronic component 18 and the coaxial cable.

According to such an electronic device 3A according to Example 2, since it includes the package 2A for housing electronic components according to Example 2, it is possible to provide an electronic device in which a transmission loss of a high-frequency signal is hard to occur at the connection portion between the wiring substrate 7 and the flexible substrate 8, and this connection portion has a sufficient mechanical strength.

Figure 9:
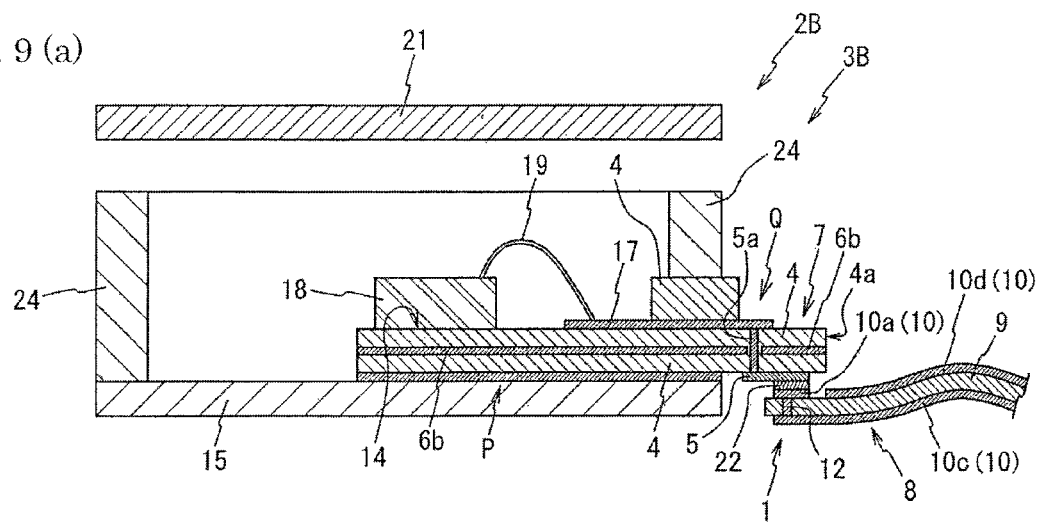
FIG. 9(a) is a cross-sectional view of a connection structure for a wiring substrate and a flexible substrate, a package for housing electronic components using the same, and an electronic device using the same according to a modification of Example 2 of the present invention.
FIG. 9(b) is a cross-sectional view of a connection structure for a wiring substrate and a flexible substrate, a package for housing electronic components using the same, and an electronic device using the same according to another modification of Example 2 of the present invention.
Figure 9:
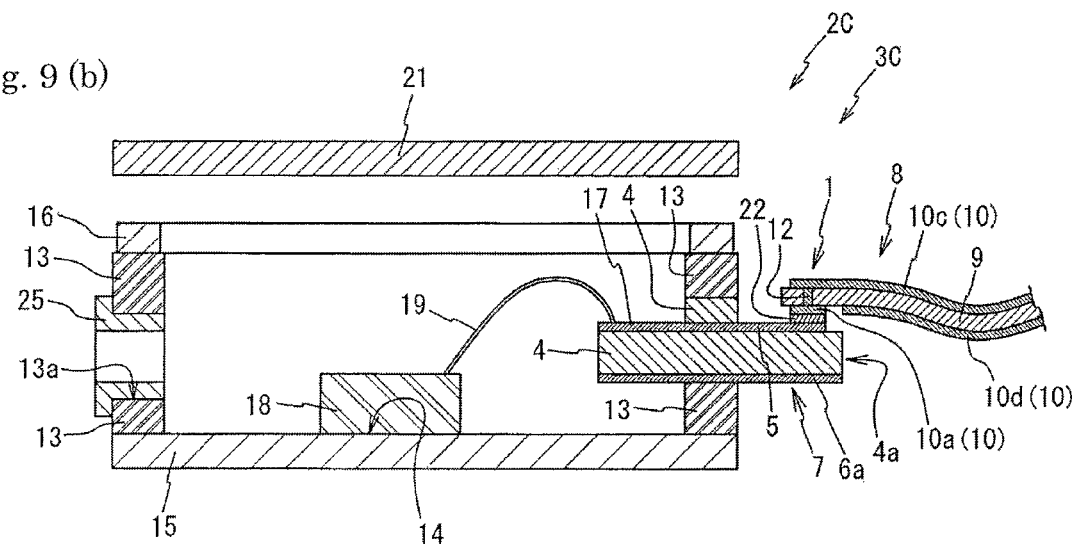

Next, a package for housing electronic components and an electronic device using the same according to a modification of Example 2 and another modification will be described with reference to FIG. 9.

FIG. 9(a) is a cross-sectional view of a connection structure for a wiring substrate and a flexible substrate, a package for housing electronic components using the same, and an electronic device using the same according to a modification of Example 2 of the present invention. FIG. 9(b) is a cross-sectional view of a connection structure for a wiring substrate and a flexible substrate, a package for housing electronic components using the same, and an electronic device using the same according to another modification of Example 2 of the present invention. The same portions as those described in FIGS. 1 to 8 are denoted by the same reference numerals, and description of the configuration is omitted. Here, differences from the package 2A for housing electronic components and the electronic device 3A according to Example 2 shown in FIG. 1 will be described.

A package 2B for housing electronic components according to a modification of Example 2 is formed by inserting the wiring substrate 7 into a frame portion 24 that is separate from the wiring substrate 7.

In addition, the wiring substrate 7 in the package 2B for housing electronic components according to the modification of Example 2 is a ceramic multilayer substrate, and includes an inner layer ground region 6b in a cross section in the thickness direction of the insulating member 4. Further, in the package 2B for housing electronic components according to the modification of Example 2, the main surface P of the wiring substrate 7 is disposed on the back surface side of the package 2B for housing electronic components, and the heat sink 15 and the flexible substrate 8 are joined to the main surface P side of the wiring substrate 7.

In addition, in the wiring substrate 7 shown in FIG. 9(a), the wiring substrate 7 is provided at the frame portion 24 in a state of being inverted upside down as compared with the case shown in FIG. 1. For this reason, the wiring substrate 7 includes a via 5a penetrating the insulating member 4, and a high-frequency signal transmitted from the flexible substrate 8 to the main surface P side of the wiring substrate 7 through a via conductor filled in the via 5a is transmitted to the back surface Q side of the wiring substrate 7. In the wiring substrate 7 shown in FIG. 9(a), the electronic component mounting portion 14 is provided on the back surface Q side of the wiring substrate 7.

Further, in the package 2B for housing electronic components according to the modification of Example 2, when the material of the frame portion 24 is metal, for example, the metal lid 21 can be directly seam-welded to the opening of the frame portion 24.

According to such a package 2B for housing electronic components according to the modification of Example 2, since it includes the connection structure for a wiring substrate and a flexible substrate according to Example 1 described above or its modification, it is possible to provide a package for housing electronic components in which a transmission loss of a high-frequency signal is hard to occur at the connection portion between the wiring substrate 7 and the flexible substrate 8.

Further, an electronic device 3B according to a modification of Example 2 is obtained by mounting the electronic component 18 on the electronic component mounting portion 14 of the package 2B for housing electronic components according to the modification of Example 2, connecting the electronic component 18 and the wire bonding pad 17 on the wiring substrate 7 by the bonding wire 19, and further sealing an upper opening of the frame portion 24 with the lid 21.

According to the electronic device 3B according to the modification of Example 2, it is possible to provide an electronic device in which a transmission loss of a high-frequency signal is hard to occur at a connection portion between the wiring substrate 7 and the flexible substrate 8, and this connection portion has a sufficient mechanical strength.

Further, a package for housing electronic components and an electronic device including the same according to another modification of Example 2 will be described with reference to FIG. 9(b).

As shown in FIG. 9(b), the package for housing electronic components according to another modification of Example 2 includes a flat plate-like heat sink 15, an electronic component mounting portion 14 provided on the surface of the heat sink 15, a frame portion 13 provided so as to surround the electronic component mounting portion, and the connection structure (including modification thereof) for a wiring substrate and a flexible substrate according to Example 1 disposed outside the frame portion, and the wiring substrate 7 is inserted into the frame portion 13.

In the package 2A, 2B for housing electronic components according to Example 2 and its modification, the electronic component 18 is mounted on the wiring substrate 7, and the heat sink 15 is joined to the wiring substrate 7. On the other hand, in the package 2C for housing electronic components according to another modification of Example 2, the heat sink 15 is provided separately from the wiring substrate 7, and the heat sink 15 includes the electronic component mounting portion 14. For this reason, the package 2C for housing electronic components according to another modification of Example 2 has a higher performance for dissipating heat generated from the electronic component 18 than the package 2A, 2B for housing electronic components according to Example 2 and its modification.

In the package 2C for housing electronic components according to another modification of Example 2, the wiring substrate 7 may form a part of the frame portion 13. That is, only a part of the frame portion 13 is made of the insulating member 4 and is integrated with the wiring substrate 7, and the remainder of the frame portion 13 may be a metal material, or the whole material may be the insulating member 4 and further the frame portion 13 may be integrated with the wiring substrate 7. In this case, since the work of fixing the wiring substrate 7 to the frame portion 13 can be omitted, the production efficiency of the package 2C for housing electronic components according to another modification of Example 2 can be improved.

Further, in the package 2C for housing electronic components according to the modification of Example 2, the frame portion 13 includes a through hole 13a as a selective component, and an optical fiber mounting member 25 may be fixed to the through hole 13a as necessary. In this case, an optical fiber can be connected to the package 2C for housing electronic components according to the modification of Example 2 as necessary.

In addition, the package 2C for housing electronic components according to the modification of Example 2 may include the metal ring 16 as a selective component in the upper opening of the frame portion 13. In this case, there is an effect that the metal lid 21 is joined to the metal ring 16 by seam welding, so that the electronic component 18 can be hermetically sealed.

According to such a package 2C for housing electronic components according to another modification of Example 2, since it includes the connection structure for a wiring substrate and a flexible substrate according to Example 1 described above or its modification, it is possible to provide a package for housing electronic components in which a transmission loss of a high-frequency signal is hard to occur at the connection portion between the wiring substrate 7 and the flexible substrate 8.

Further, an electronic device 3C according to another modification of Example 2 is obtained by mounting the electronic component 18 on the electronic component mounting portion 14 in the package 2C for housing electronic components according to another modification of Example 2, connecting the electronic component 18 and the wire bonding pad 17 of the wiring substrate 7 by the bonding wire 19, and further hermetically sealing the upper opening of the frame portion 13 with the lid 21.

According to such an electronic device 3C according to another modification of Example 2, since it includes the package 2C for housing electronic components according to another modification of Example 2, it is possible to provide an electronic device in which a transmission loss of a high-frequency signal is hard to occur at the connection portion between the wiring substrate 7 and the flexible substrate 8, and this connection portion has a sufficient mechanical strength.

Here, a result of simulation performed in order to confirm the effect of this invention is demonstrated. First, conditions of the simulation will be described with reference to FIGS. 10 to 12.

FIG. 10(a) is a cross-sectional view of a virtual connection structure for a wiring substrate and a flexible substrate to be simulated, and FIG. 10(b) is a partially enlarged view of FIG. 10(a). The same portions as those described in FIGS. 1 to 9 are denoted by the same reference numerals, and description of the configuration is omitted.

FIG. 11 is a table summarizing materials, thicknesses, dielectric constants, and the like of the components constituting the virtual connection structure for a wiring substrate and a flexible substrate shown in FIGS. 10(a) and 10(b). The simulation is performed assuming that the electrical resistances of the metal materials are all zero (perfect conductor) regardless of the materials.

Figure 10:
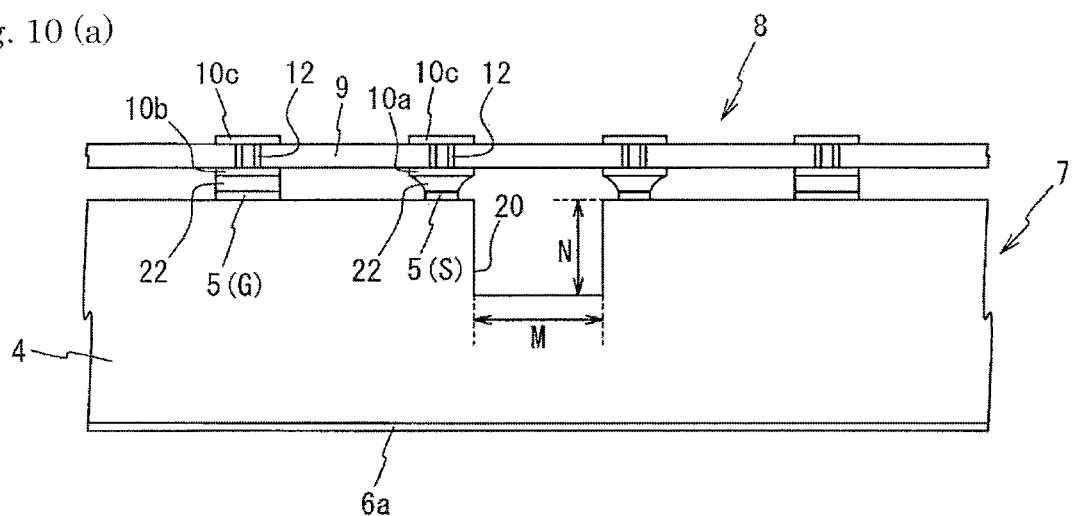
FIG. 10(a) is a cross-sectional view of a virtual connection structure for a wiring substrate and a flexible substrate to be simulated.
FIG. 10(b) is a partially enlarged view of FIG. 10(a).
Figure 10:
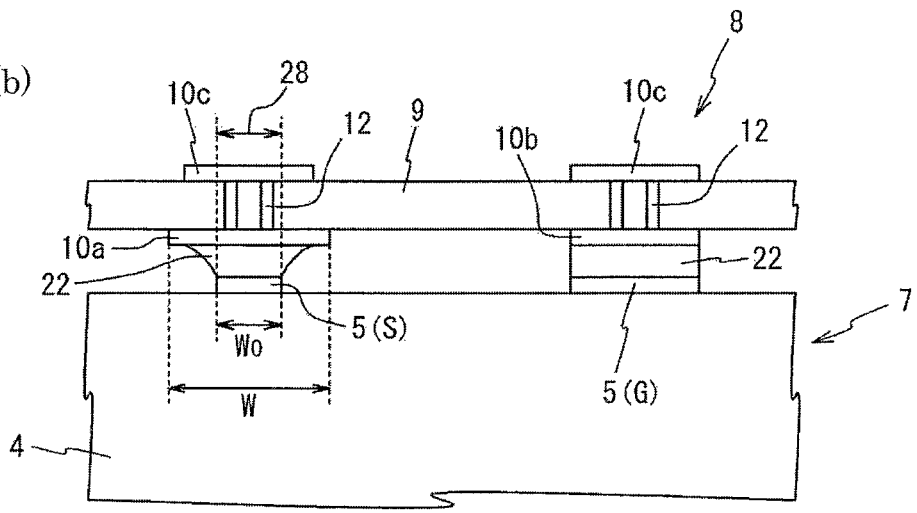

In this simulation, simulation software (made by Ansys, product name: Q3D Extractor ver12.0) was used to perform two-dimensional simulation in a cross-section perpendicular to the signal transmission direction of the connection portion between the wiring substrate 7 and the flexible substrate 8 as shown in FIG. 10 under the conditions shown in FIG. 11.

This simulation verifies, by two-dimensional simulation, how the characteristic impedance changes in a cross-section perpendicular to the signal transmission direction of the connection portion, when the widths of the signal line conductor layer 5(S) and the signal line pad 10a related to the connection portion in the connection structure 1, 1' for a wiring substrate and a flexible substrate according to Example 1 and its modification are variously changed.

Then, the width $W_0$ of the signal line conductor layer including the overlap region and the width W of the signal line pad also including the overlap region in each Example and each Comparative Example in this simulation are collectively shown in a table of FIG. 12.

In this simulation, the width $W_0$ of the signal line conductor layer 5(S) belonging to the overlap region 28 where the signal line conductor layer 5(S) and the signal line pad 10a are overlapped, and the width W of the signal line pad 10a also belonging to the overlap region 28 are set as shown in FIG. 12, and design (setting) has been made so that the characteristic impedance of the connection portion in a state where a deviation is not occurring between the center line I of the signal line conductor layer 5(S) and the center line J of the signal line pad 10a becomes 100Ω by optimizing the dimensions of the spot facing portion 20.

That is, in this simulation, the width $W_0$ of the signal line conductor layer 5(S) including the overlap region 28 and the width W of the signal line pad 10a also including the overlap region 28 of each Example and each Comparative Example are set as shown in FIG. 12, and the dimensions of the spot facing portion 20 are optimized. In other words, the dimensions of the spot facing portion 20 are designed (set) so that the characteristic impedance of the connection portion in the state where a deviation is not occurring between the center line I of the signal line conductor layer 5(S) and the center line J of the signal line pad 10a becomes 100Ω (see FIG. 12).

Furthermore, from this state, a variation in the characteristic impedance with respect to the design value (100Ω) when the deviation in the width direction of the signal line conductor layer 5(S) occurred between the center line I and the center line J by the same amount as the deviation tolerance δ is also investigated. In this simulation, the deviation tolerance δ is set to 50 μm. The simulation results are shown in FIG. 13.

As shown in FIG. 13, in Comparative Example 1, the width $W_0$ of the signal line conductor layer 5(S) is equal to the width W of the signal line pad 10a, both of which are 100 μm. As shown in FIG. 12, since the distance between the center lines I of the signal line conductor layers 5(S) is 500 μm, the width in which the spot facing portion 20 can be formed is 400 μm (see FIG. 12). As shown in FIG. 12, in any of Comparative Examples and Examples, the depth at which the spot facing portion 20 can be formed is 440 μm, which is the same as the thickness of the insulating member 4.

Further, as shown in FIG. 13 above, each of Comparative Examples 2A to 2D is designed to increase the width $W_0$ of the signal line conductor layer 5(S) in units of 50 μm with reference to Comparative Example 1. Therefore, the width in which the spot facing portion 20 can be formed in Comparative Examples 2A to 2D is smaller than that in Comparative Example 1 as the width $W_0$ of the signal line conductor layer 5(S) increases.

In Comparative Examples 2A to 2D, since the width W of the signal line pad 10a is the same as that in Comparative Example 1 and is constant, unlike the case of the invention disclosed in Patent Document 1, the adhesion strength of the signal line pad 10a (metal film 10) in the flexible substrate 8 does not decrease. If the technical contents disclosed in Patent Document 1 are applied to Comparative Example 1, the width W of the signal line pad 10a is set within a range of 60 to 100 μm.

On the other hand, Examples A to C and Comparative Example 3 are designed to increase the width W of the signal line pad 10a in units of 50 μm with reference to Comparative Example 1.

Therefore, the width in which the spot facing portion 20 can be formed is the same as that in Comparative Example 1.

FIG. 13 is a table showing, for each component shown in FIG. 10, the simulation results of the variation in the characteristic impedance with respect to the design value when a deviation occurs between the center line I and the center line J under the conditions shown in FIGS. 11 and 12.

As shown in FIG. 13, in Comparative Example 1, the characteristic impedance in a state in which no deviation occurs between the center line I of the signal line conductor layer 5(S) and the center line J of the signal line pad 10a at the connection portion between the wiring substrate 7 and the flexible substrate 8 is 100Ω, which is the same as the design value without provision of the spot facing portion 20. In addition, when the deviation of 50 μm occurs between the center line I of the signal line conductor layer 5(S) and the center line J of the signal line pad 10a, the variation in the characteristic impedance with respect to the design value (100Ω) is 2.8Ω, which is the largest in the simulation results.

On the other hand, in Comparative Examples 2A and 2B, when the width $W_0$ of the signal line conductor layer 5(S) is set to 150 μm and 200 μm, respectively, in order to make the characteristic impedance 100Ω of the design value, the dimensions of the spot facing portion need to be set to 155 μm×200 μm and 265 μm×400 μm, respectively. Further, in Comparative Examples 2A and 2B, the variation in the characteristic impedance with respect to the design value when a deviation of 50 μm occurs between the center line I of the signal line conductor layer 5(S) and the center line J of the signal line pad 10a is 2.3Ω in Comparative Example 2A and 2.0Ω in Comparative Example 2B, and there is a tendency that the variation in the characteristic impedance from the design value decreases as the width $W_0$ of the signal line conductor layer 5(S) increases. Further, in Comparative Examples 2A and 2B, the variation in the characteristic impedance with respect to the design value (100Ω) is smaller than that in Comparative Example 1 described above.

Further, in Comparative Examples 2C and 2D, the width $W_0$ of the signal line conductor layer 5(S) is set to 250 μm and 300 μm, respectively, and in both cases, within a range in which the spot facing portion 20 can be formed, there are no dimensions of the spot facing portion that can make the characteristic impedance at the connection portion between the wiring substrate 7 and the flexible substrate 8 100Ω.

Further, Example A according to the present invention is obtained by replacing the value of the width $W_0$ of the signal line conductor layer 5(S) with the value of the width W of the signal line pad 10a in Comparative Example 2A. In this case, the characteristic impedance can be made 100Ω, which is the same as the design value, by setting the dimensions of the spot facing portion to 100 μm×75 μm. Further, the dimensions of the spot facing portion of Example A according to the present invention are smaller than those of Comparative Example 2A. For this reason, the production efficiency when processing the spot facing portion of Example A according to the present invention with a laser or the like is higher than that of Comparative Example 2A. Further, in Example A according to the present invention, the variation in the characteristic impedance with respect to the design value (100Ω) when a deviation of 50 μm occurs between the center line I of the signal line conductor layer 5(S) and the center line J of the signal line pad 10a is 2.6Ω, which is larger than that in Comparative Example 2A.

On the other hand, Example B according to the present invention is obtained by replacing the value of the width $W_0$ of the signal line conductor layer 5(S) with the value of the width W of the signal line pad 10a in Comparative Example 2B, and the width $W_0$ of the signal line conductor layer 5(S) and the width W of the signal line pad 10a satisfy the relational expression ($W=W_0+2\delta$). In this case, the characteristic impedance can be set to 100Ω of the design value by setting the dimensions of the spot facing portion of Example B according to the present invention to 205 μm×130 μm. The dimensions of the spot facing portion in Example B are smaller than those in Comparative Example 2B.

Further, in Example B according to the present invention, the variation in the characteristic impedance with respect to the design value when a deviation of 50 μm occurs between the center line I of the signal line conductor layer 5(S) and the center line J of the signal line pad 10a is 1.1Ω, which is smaller than that in Comparative Example 2B. In other words, the effect of suppressing the variation in the characteristic impedance when the deviation occurs between the center line I and the center line J at the connection portion between the wiring substrate 7 and the flexible substrate 8 is higher in Example B than in Comparative Example 2B.

On the other hand, Example C according to the present invention is obtained by replacing the value of the width $W_0$ of the signal line conductor layer 5(S) with the value of the width W of the signal line pad 10a in Comparative Example 2C, and the width $W_0$ of the signal line conductor layer 5(S) and the width W of the signal line pad 10a satisfy the relational expression ($W=W_0+3\delta$). In this case, the characteristic impedance can be set to 100Ω of the design value by setting the dimensions of the spot facing portion of Example C according to the present invention to 285 µm×250 µm. As shown in FIG. 13, in Comparative Example 2C, it is not possible to set the dimensions of the spot facing portion so as to set the characteristic impedance to 100Ω of the design value.

Further, in Example C according to the present invention, the variation in the characteristic impedance with respect to the design value when a deviation of 50 µm occurs between the center line I of the signal line conductor layer 5(S) and the center line J of the signal line pad 10a is 0.5Ω, which is smallest in all conditions shown in FIG. 12 above.

That is, in Example C according to the present invention, the effect of suppressing the variation in the characteristic impedance when a deviation occurs between the center line I of the signal line conductor layer 5(S) and the center line J of the signal line pad 10a at the connection portion between the wiring substrate 7 and the flexible substrate 8 by the same amount as the deviation tolerance δ, is the largest.

Comparing Examples A to C of the present invention shown in FIG. 13, there is a tendency that as the value of the width W of the signal line pad 10a with respect to the width $W_0$ of the signal line conductor layer 5(S) increases, the variation in the characteristic impedance when a deviation occurs between the center line I and the center line J at the connection portion between the wiring substrate 7 and the flexible substrate 8 becomes small.

In particular, when the value of the width W of the signal line pad 10a satisfies $(W_0+2δ)≤W$, at the connection portion between the wiring substrate 7 and the flexible substrate 8, even if a deviation occurs between the center line I of the signal line conductor layer 5(S) and the center line J of the signal line pad 10a by the same amount as the deviation tolerance δ, the signal line conductor layer 5(S) does not protrude in the width direction of the signal line pad 10a, and therefore the facing area does not fluctuate. For this reason, the effect of reducing the variation in the characteristic impedance with respect to the design value can be more reliably exhibited.

Further, considering the case where the width $W_0$ of the signal line conductor layer 5(S) is equal to the width W of the signal line pad 10a as a reference, it is possible to set wider the range of the width W of the signal line pad 10a in which the characteristic impedance at the connection portion between the wiring substrate 7 and the flexible substrate 8 is 100Ω, which is the same as the design value, in the case where the width W of the signal line pad 10a is set larger than the width $W_0$ of the signal line conductor layer 5(S) (Examples A to C), than in the case where the width $W_0$ of the signal line conductor layer 5(S) is set larger than the width W of the signal line pad 10a (Comparative Examples 2A and 2B).

For this reason, in Example C of the present invention, the variation in the characteristic impedance with respect to the design value when a deviation occurs between the center line I and the center line J at the connection portion between the wiring substrate 7 and the flexible substrate 8 can be made smallest in all conditions in FIG. 12 above. As a result, in Example C, the characteristic impedance at the connection portion between the wiring substrate 7 and the flexible substrate 8 can be approximated to the design value of 100Ω.

That is, Example C where the value of the width W of the signal line pad 10a satisfies $(W_0+2δ)≤W≤(W_0+3δ)$ demonstrates that the effect of approximating the characteristic impedance at the connection portion of the actual product (when an unavoidable deviation occurs between the center lines I and J in the connection structure 1 for a wiring substrate and a flexible substrate) to the design value is extremely excellent.

As shown in FIG. 13, Comparative Example 3 is obtained by replacing the value of the width $W_0$ of the signal line conductor layer 5(S) with the value of the width W of the signal line pad 10a in Comparative Example 2D. Further, the width $W_0$ of the signal line conductor layer 5(S) and the width W of the signal line pad 10a in Comparative Example 3 satisfy the relational expression $(W=W_0+4δ)$. In this case, there are no dimensions of the spot facing portion that make the characteristic impedance at the connection portion between the wiring substrate 7 and the flexible substrate 8 100Ω of the design value within the range of the width in which the spot facing portion 20 can be formed shown in FIG. 12 above. In Examples A to C, the width W of the signal line pad 10a increases in this order. In this case, there is a tendency that as the width W of the signal line pad 10a increases, the dimensions of the spot facing portion that make the characteristic impedance at the connection portion between the signal line conductor layer 5(S) and the signal line pad 10a 100Ω of the design value increase. Furthermore, when the width W of the signal line pad 10a exceeds $(W_0+3δ)$ (Comparative Example 3), it is confirmed that the advantageous effects according to the present invention cannot be exhibited.

Therefore, from the simulation, it is confirmed that according to the connection structure 1 for a wiring substrate and a flexible substrate according to the present invention, when the wiring substrate 7 and the flexible substrate 8 are connected, significant variation of the characteristic impedance value from the design value (the characteristic impedance value when the deviation does not occur between the center line I and the center line J) can be suppressed when a deviation occurs between the center line I of the signal line conductor layer 5(S) and the center line J of the signal line pad 10a.

Further, as shown in FIGS. 11, 12, and 13, when the above-described effects are exhibited, in the connection structure 1 for a wiring substrate and a flexible substrate according to the present invention (Examples A to C), the width W of the signal line pad 10a including the overlap region 28 is relatively wider than the width $W_0$ of the signal line conductor layer 5(S) also including the overlap region 28. Therefore, unlike the case of the invention disclosed in Patent Document 1, the adhesion strength of the signal line pad 10a (metal film 10) on the flexible substrate 8 does not decrease. For this reason, the joint strength in the connection structure (the present invention) formed by joining the signal line pad 10a and the signal line conductor layer 5(S) via the joining material 22 also does not decrease.

As described above, according to the connection structure 1 for a wiring substrate and a flexible substrate according to the present invention, the effect of suppressing the decrease in mechanical strength at the connection portion between the wiring substrate 7 and the flexible substrate 8 can be also exhibited at the same time.

Note that, ceramics that can be used for the insulating member 4 of the wiring substrate 7 according to the present invention and the relative permittivity thereof are as shown below.

Relative permittivity of alumina substrate: 7.5-10 (relative permittivity varies depending on alumina content and additive type)

Relative permittivity of aluminum nitride substrate: 8.8

Relative permittivities of various glass ceramic substrates: 4-10 (There are many types of glass ceramics, and the relative permittivity varies depending on the components)

Relative permittivity of silicon nitride substrate: 8.1

Further, the conductor layer 5, via 5a, first ground region 6a, and inner layer ground region 6b of the wiring substrate 7 according to the present invention can use a material obtained by appropriately selecting metal powder such as tungsten, molybdenum, manganese, copper, or silver singly or in a combination of a plurality of types according to the firing temperature, mixing it with an appropriate binder, solvent, or the like to produce a conductor paste, printing and applying this conductor paste on a ceramic green sheet before firing or the like, and then firing it (900 to 1600° C.). Further, the thicknesses of the conductor layer 5, the via 5a, and the first ground region 6a do not have to be specified as those described in FIG. 11 above, and may be appropriately changed in a range not departing from the gist of the present invention.

Furthermore, as a material that can be used for the insulating sheet 9 according to the present invention, a liquid crystal polymer or Teflon (registered trademark) can be used in addition to the polyimide described in FIG. 11. As a material of the insulating sheet 9, the one that is made of a flexible insulating material, has heat resistance capable of joining solder or a conductive adhesive, and has a relative permittivity of 2 to 5 can be used without any problems.

Further, as a material that can be used as the metal film 10 of the flexible substrate 8 according to the present invention, aluminum can be used in addition to the copper described in FIG. 11. As the metal film 10, the one that can be processed into a thin film and has heat resistance capable of joining solder or a conductive adhesive can be used without any problems.

In addition, as described above, a conductive adhesive can be used for the joining material 22 other than solder.

By provision of the connection structure 1 for a wiring substrate and a flexible substrate according to the present invention, a high-frequency signal of 10 to 70 GHz can be appropriately transmitted.

Note that, the variables (parameters) defined in the invention according to Example 1 and its modification (connection structure 1 for a wiring substrate and a flexible substrate) can be applied as they are even in a case where the material of each component in the virtual connection structure for a wiring substrate and a flexible substrate shown in FIG. 10 is appropriately replaced with that described above.

INDUSTRIAL APPLICABILITY

As described above, the present invention is a connection structure for a wiring substrate and a flexible substrate that can appropriately suppress the occurrence of high-frequency signal transmission loss at the connection portion between the wiring substrate and the flexible substrate and can prevent reduction in mechanical strength of the connection portion, and a package for housing electronic components including the connection structure, and can be used in the technical field related to electronic components.

DESCRIPTION OF REFERENCE SIGNS 1, 1': Connection structure for wiring substrate and flexible substrate
2A-2C: Package for housing electronic components
3A-3C: Electronic device
4: Insulating member
4a: End surface
4b: Non-formation region
4c: Side surface
5: Conductor layer
5(S): Signal line conductor layer
5(G): Ground line conductor layer
5a: Via
6a: First ground region
6b: Inner layer ground region
7: Wiring substrate
8: Flexible substrate
9: Insulating sheet
9a: End edge
10: Metal film
10a, 10a': Signal line pad
10b: Ground line pad
10c: Transmission zone
10d: Second ground region
11: Notch
12: Through conductor
13: Frame portion
13a: Through hole
14: Electronic component mounting portion
15: Heat sink
16: Metal ring
17: Wire bonding pad
17(S): Wire bonding pad for signal line
17(G): Wire bonding pad for ground line
18: Electronic component
19: Bonding wire
20: Spot facing portion
21: Lid
22: Joining material
23: Plating wiring
24: Frame portion
25: Optical fiber mounting member
26: Useful connection portion
27: Connection portion
28, 28a, 28b: Overlap region
29: Spot facing portion
F: Signal transmission direction
G: Overlap region length
I: Center line
J: Center line
P, P': Main surface
Q, Q': Back surface
X: Main region
Y: Sub-region

The invention claimed is:

1. A connection structure for a wiring substrate and a flexible substrate, comprising:
a wiring substrate; and
a flexible substrate joined to the wiring substrate, wherein
the wiring substrate includes a ceramic insulating member, a signal line conductor layer provided at least on a main surface of the insulating member, and a ground layer provided on a back surface or an inside of the insulating member,
the flexible substrate includes a resin insulating sheet and a metal film provided at least on a main surface of the insulating sheet,
the metal film includes a signal line pad provided on a main surface side of the flexible substrate and joined to the signal line conductor layer via a joining material,
when the connection structure is seen through from a back surface side of the flexible substrate, the connection structure includes an overlap region in which the signal line pad and the signal line conductor layer are overlapped, the insulating member includes a spot facing portion that has a recessed cross section that is formed between each of the overlap regions that form a pair when the wiring substrate is viewed in a plan view, and the spot facing portion has at least a same length as the overlap regions when the wiring substrate is seen through from a side surface side thereof, and in a case where a width of the signal line pad belonging to the overlap region when the overlap region is cut in a direction perpendicular to a signal transmission direction is W, and a width of the signal line conductor layer belonging to the overlap region is $W_0$, the connection structure includes a useful connection portion satisfying $W_0<W$.

2. The connection structure for a wiring substrate and a flexible substrate according to claim 1, wherein the width W of the signal line pad of the useful connection portion, when a deviation tolerance of a center line of the signal line conductor layer with respect to a center line of the signal line pad is $\delta$, satisfies $W_0<W\leq(W_0+3\delta)$.

3. The connection structure for a wiring substrate and a flexible substrate according to claim 2, wherein the width W of the signal line pad in the useful connection portion satisfies $(W_0+2\delta)\leq W\leq(W_0+3\delta)$.

4. The connection structure for a wiring substrate and a flexible substrate according to claim 2, wherein the deviation tolerance $\delta$ satisfies $\delta\leq 60$ µm.

5. The connection structure for a wiring substrate and a flexible substrate according to claim 1, wherein the useful connection portion occupies 50% or more of a length of the overlap region in a direction parallel to the signal transmission direction in the overlap region.

6. The connection structure for a wiring substrate and a flexible substrate according to claim 1, wherein the insulating member includes a non-formation region that does not include a conductor layer on a main surface side thereof, has a substantially flat surface shape, has a strip shape, and is formed along an end surface of the insulating member.

7. A package for housing electronic components, comprising:

a connection structure for a wiring substrate and a flexible substrate according to claim 1;

an electronic component mounting portion provided on a main surface or a back surface of the wiring substrate; and a frame portion provided so as to surround the electronic component mounting portion, wherein:

the wiring substrate is inserted into the frame portion or forms a part of the frame portion, and the connection structure is disposed outside the frame portion.

8. A package for housing electronic components, comprising:

a heat sink in a flat plate shape;

an electronic component mounting portion provided on a surface of the heat sink;

a frame portion provided so as to surround the electronic component mounting portion; and a connection structure for a wiring substrate and a flexible substrate according to claim 1, which is disposed outside the frame portion, wherein the wiring substrate is inserted into the frame portion or forms a part of the frame portion.

* * * * *